United States Patent [19]

Matsuo et al.

[11] Patent Number: 5,659,515
[45] Date of Patent: Aug. 19, 1997

[54] SEMICONDUCTOR MEMORY DEVICE CAPABLE OF REFRESH OPERATION IN BURST MODE

[75] Inventors: Ryuichi Matsuo; Tomohisa Wada, both of Hyogo, Japan

[73] Assignee: Mitsubishi Denki Kabushiki Kaisha, Tokyo, Japan

[21] Appl. No.: 520,190

[22] Filed: Aug. 28, 1995

[30] Foreign Application Priority Data

Oct. 31, 1994 [JP] Japan .................................. 6-267654

[51] Int. Cl.$^6$ .......................................... G11C 7/00
[52] U.S. Cl. ................... 365/222; 365/230.03; 365/233; 365/238.5
[58] Field of Search ............................. 365/222, 230.03, 365/233, 238.5

[56] References Cited

U.S. PATENT DOCUMENTS

| | | | |
|---|---|---|---|
| 4,185,323 | 1/1980 | Johnson et al. | 365/222 |
| 4,691,303 | 9/1987 | Churchward et al. | 365/222 |
| 5,253,211 | 10/1993 | Suzuki | 365/222 |

FOREIGN PATENT DOCUMENTS

| | | |
|---|---|---|
| 62-165784 | 7/1987 | Japan . |
| 1-243147 | 9/1989 | Japan . |
| 2-7141 | 1/1990 | Japan . |

OTHER PUBLICATIONS

Designing CMOS VLSIs, published by Baifukan in Japan, Apr. 25, 1989.

Shoji Hanamura et al., A 256K CMOS SRAM with Internal Refresh, IEEE International Solid–State Circuits Conference, 1987, pp. 250–251 and 414.

Primary Examiner—David C. Nelms
Assistant Examiner—F. Niranjan
Attorney, Agent, or Firm—Lowe, Price, LeBlanc & Becker

[57] ABSTRACT

A semiconductor memory device comprising a memory cell array, a row decoder, an input/output register train, a burst counter, an input/output bus, a refresh counter and a multiplexer. The memory cell array includes a plurality of word lines, a plurality of bit line pairs and a plurality of memory cells. The input/output register train has a plurality of registers corresponding to the bit line pairs. Each of the registers is connected to the corresponding bit line pair. The input/output bus inputs and outputs data to and from the register train in response to a signal from the burst counter. The multiplexer supplies the row decoder with an external address signal as an internal address signal. After data is transferred from any bit line pair to the register or before data is transferred from any register to the bit line pair, the multiplexer supplies the row decoder with a refresh address signal from the refresh counter in place of the external address signal. This allows a refresh operation to take place during a burst read/write operation of data.

12 Claims, 28 Drawing Sheets

SEMICONDUCTOR MEMORY DEVICE CAPABLE OF REFRESH OPERATION IN BURST MODE

BACKGROUND OF THE INVENTION

1. Field of the Invention

The present invention relates to a semiconductor memory device. More particularly, the invention relates to a semiconductor memory device affording a burst mode in which a plurality of data are read or written continuously in response to a single external address signal.

2. Description of the Background Art

In general, memories fall into two broad categories: random access memories (RAMs) and read only memories (ROMs). The RAMs are further divided into dynamic RAMs (DRAMs) and static RAMs (SRAMs). The DRAM stores data on the basis of the presence or absence of charges in each of the capacitors constituting the memory. The SRAM retains data in the flip-flop circuits making up the memory.

Below is a brief description of the DRAMs. The most popular of the DRAMs from the four-kilobit generation onward comprises memory cells each composed of one n-channel MOS transistor and one capacitor. Such memory cells are also adopted in today's one-megabit, four-megabit and 16-megabit DRAMs.

FIG. 22 is a circuit diagram of a memory cell in a DRAM. FIG. 23A is a plan view of a trench type memory cell structure in a DRAM, and FIG. 23B is a cross-sectional view taken on line B—B in FIG. 23A. FIGS. 22, 23A and 23B are shown on pages 158 and 160 in "Designing CMOS VLSIs" published by Baifukan in Japan, the first edition issued on Apr. 25, 1989.

As shown in FIGS. 22, 23A and 23B, a dynamic memory cell DMC for the DRAM comprises one access transistor T1 and one cell capacitor Cs. In a write operation, the potential of a word line WL is brought to the high level (i.e., logical High) to let the access transistor T1 conduct. This allows the potential of a bit line BL to be transmitted to one of two electrodes of the cell capacitor Cs, i.e., to a memory node M1, through the access transistor T1. When the potential of the bit line BL is High, the potential of the memory node M1 is also High; when the potential of the bit line BL is at the low level (i.e., logical Low), the potential of the memory node M1 is also Low. Driving the word line WL Low prevents the access transistor T1 from conducting. This causes electrical charges to be accumulated in the cell capacitor Cs. The other electrode of the cell capacitor Cs is fed with a predetermined constant cell plate potential Vcp.

In a read operation, the bit line BL is first precharged to a predetermined potential level. The potential of the word line WL is then driven High. This causes the access transistor T1 to conduct, allowing the charge in the memory node M1 to be read out onto the bit line BL through the access transistor T1. This in turn causes the potential of the bit line BL to change from the predetermined constant level. The resultant potential difference is amplified by a sense amplifier, not shown.

The SRAM will now be described briefly. Each of the static memory cells for the SRAM is composed of a bistable circuit such as a flip-flop circuit. The static memory cells fall into several categories. The cell that uses an n-channel MOS transistor as its load element is called an NMOS load type cell; the cell that utilizes a p-channel MOS transistor as its load element is called a CMOS type cell; the cell employing a high resistance as its load element is called a high resistance load type cell; and the cell adopting a p-channel MOS thin film transistor as its load element is called a TFT type cell. The most prevalent today is the high resistance load type cell.

FIG. 24 is a circuit diagram of a static memory cell in an SRAM. FIG. 25 is a plan view of the static memory cell structure in FIG. 24. FIGS. 24 and 25 are found on page 164 in the publication "Designing CMOS VLSIs" cited above.

As shown in FIGS. 24 and 25, the static memory cell SMC comprises two access transistors T2 and T3, high resistances R1 and R2 with their memory nodes M2 and M3 pulled up to a supply potential Vcc, and two driver transistors T4 and T5 cross-coupled.

In a write operation, the potential of the word line WL is brought High to let the access transistors T2 and T3 conduct. This transmits the potential of a bit line BL to the memory node M2 via the access transistor T2 and gives the potential of a bit line /BL to the memory node M3 via the access transistor T3. For example, if the bit line BL is High and the bit line /BL is Low, the potential of the memory node M2 is brought High and that of the memory node M3 Low. When the potential of the word line WL is driven Low, the access transistors T2 and T3 are both prevented from conducting. Because the high resistances R1 and R2 and the driver transistors T4 and T5 constitute a bistable circuit (i.e., flip-flop circuit), the memory nodes M2 and M3 retain the potential levels they have received.

In a read operation, the potential of the word line WL is brought High to let the access transistors T2 and T3 conduct. This transmits the potentials of the memory nodes M2 and M3 to the bit lines BL and /BL, respectively. The potentials thus transmitted are amplified by a sense amplifier, not shown.

FIG. 26 is a block diagram of a typical conventional SRAM capable of operating in burst mode. Referring to FIG. 26, the SRAM comprises a memory cell array 10, a row decoder 12, a bit line precharging circuit 14, and a sense amplifier and write driver train 42. The memory cell array 10 has word lines WL1 through WLx; bit line pairs BL1, /BL1 through BLm, /BLm intersecting the word lines; and a plurality of static memory cells SMC corresponding to the points of intersection between the word lines and the bit line pairs. The row decoder 12 selects one of the word lines WL1 through WLx by decoding an n-bit internal address signal intAdd supplied thereto. The bit line precharging circuit 14 precharges all bit line pairs BL1, /BL1 through BLm, /BLm. The sense amplifier and write driver train 42 includes m of sense amplifiers and m of write drivers 421 through 42m corresponding to the bit line pairs BL1, /BL1 through BLm, /BLm.

The SRAM further comprises an address register 22, a burst counter 32, a write control register 24 and a read/write control circuit 34. The address register 22 admits an n-bit external address signal extAdd in accordance with an address strobe signal ADS supplied through an AND gate 26. The burst counter 32 stores a k-bit address signal taken out of the n-bit external address signal extAdd from the address register 22. The stored address signal is incremented in response to an advance signal ADV given via an AND gate 28. The write control register 24 stores inside a write enable signal /WE in response to a clock signal CLOCK. Given the write enable signal /WE from the write control register 24, the read/write control circuit 34 controls the bit line precharging circuit 14, and the sense amplifier and write driver train 42.

FIG. 27 is a timing chart of signals in effect when the SRAM of FIG. 26 operates in burst read mode. In accordance with an address strobe signal ADS (waveform (c) in FIG. 27), an external advice signal Ai (waveform (b)) is admitted into the address register 22. Of the bits making up the external address signal Ai, k bits are placed into the burst counter 32. The burst counter 32 increments the k-bit address signal in response to the advance signal ADV (waveform (d)). After being incremented, the k-bit address signal is sent, together with the (n–k)-bit address signal from the address register 22, as the n-bit internal address signal intAdd to the row decoder 12. That is, the internal address signal intAdd (waveform (e)) varies continuously as illustrated in FIG. 27. The row decoder 12 selects any one of four word lines in response to the four successive internal address signals intAdd.

In this example, the write enable signal /WE (waveform (f) in FIG. 27) is at the high level. This means that the data read out on all bit line pairs BL1, /BL1 through BLm, /BLm are amplified by the respective sense amplifiers 421 through 42m. Then m-bit data Dout1 through Doutm (waveform (g)) are read out parallelly via a read bus 1, as depicted in FIG. 27.

FIG. 28 is a timing chart of signals in effect when the SRAM of FIG. 26 operates in burst write mode. The external address signal Ai is entered in response to the address strobe signal ADS (waveform (c) in FIG. 28). The external address signal Ai is then incremented in reply to the advance signal ADV (waveform (d)). Thus the internal address signal intAdd (waveform (e)) varies successively as indicated in FIG. 28.

Meanwhile, in accordance with the write enable signal /WE (waveform (f) in FIG. 28), m-bit data Din1 through Dinm (waveform (g)) are written to the write driver train 42 through a write data register 3 and a write bus 2. The m-bit data Din1 through Dinm are written simultaneously to the m of static memory cells SMC connected to the single word line selected. For example, the first m-bit data Di is written to the m of static memory cells SMC connected to the word line corresponding to the internal address signal Ai.

FIG. 29 is a block diagram of another conventional SRAM capable of operating in burst mode. Referring to FIG. 29, the SRAM has its memory cell array 10 made up of bit line pairs BL1, /BL1 through BL4m, /BL4m which are four times as many as the bit line pairs in FIG. 26. The SRAM further includes a 4m-to-m multiplexer 4, a column decoder 60 and a group 5 of m of bidirectional transfer buses. Of the 4m bit line pairs BL1, /BL1 through BL4m, /BL4m, m bit line pairs are connected by the multiplexer 4 to the sense amplifier and write driver train 42 via the bidirectional transfer bus group 5. Given a two-bit address signal from the burst counter 32, the column decoder 60 controls the multiplexer 4 in the manner outlined above.

As described, each of the dynamic memory cells DMC constituting the DRAM is made of one access transistor T1 and one cell capacitor Cs. It follows that only a very small area is occupied by each dynamic memory cell DMC and that a large-capacity DRAM is easy to fabricate using such cells. However, the DRAM has its capacitors store electrical charges that diminish over time. This makes it necessary for the DRAM to undergo a refresh operation at predetermined intervals so as to recharge the capacitors Cs.

On the other hand, the static memory cells SMC constituting the SRAM are bistable circuits and need not be refreshed at predetermined intervals. However, each static memory cell is generally composed of six elements that occupy a wider area than a single dynamic memory cell. This makes it difficult to fabricate a large-capacity SRAM.

The SRAMs shown in FIGS. 26 and 29 need not be refreshed in operation but are hard to fabricate as a large-capacity memory. One way of building a large-capacity SRAM would be to replace each static memory cell SMC with a dynamic memory cell DMC. Such a memory constitution using dynamic memory cells DMC, however, requires the refresh operation which excludes the use of burst mode while being carried out. The result is a worsened level of access efficiency for the memory.

SUMMARY OF THE INVENTION

It is therefore an object of the present invention to provide a semiconductor memory device permitting the execution of refresh operation in burst mode.

It is another object of the invention to provide a semiconductor memory device having a large capacity.

It is a further object of the invention to provide a semiconductor memory device permitting high access speeds.

In carrying out the invention and according to one aspect thereof, there is provided a semiconductor memory device comprising a plurality of memory cells, a burst circuit and a refresh circuit. The burst circuit gains consecutive access to at least two of the memory cells in response to one externally supplied address signal. During memory cell access by the burst circuit, the refresh circuit refreshes some of the plurality of memory cells.

This semiconductor memory device undergoes a burst operation whereby data is written to or read from at least two memory cells successively in response to one externally supplied address signal. While the burst operation is under way, at least one memory cell is refreshed. This eliminates the need for performing a refresh operation between two separate burst operations; the burst operation is allowed to be continuous.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
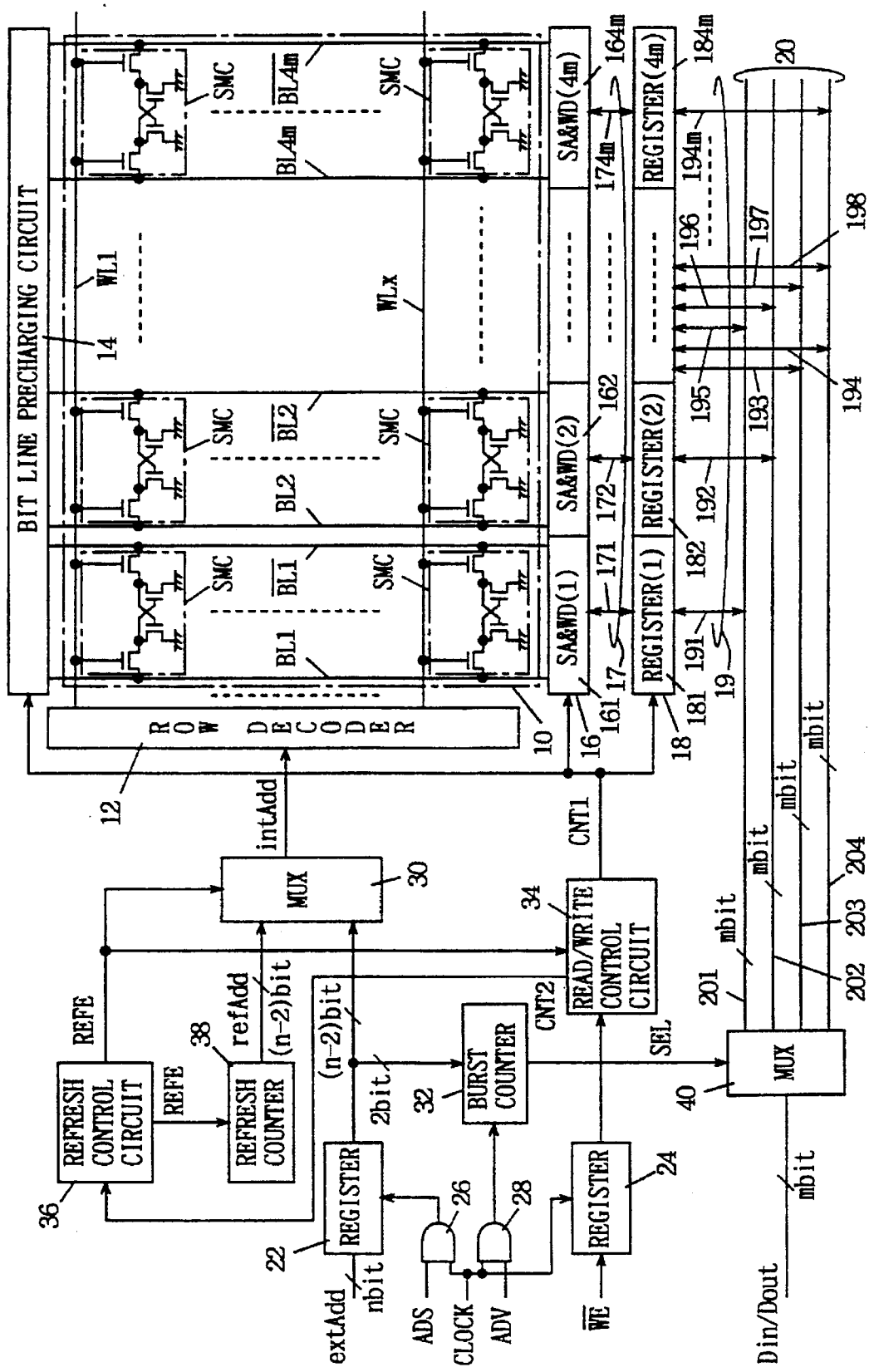
FIG. 1 is an overall block diagram of a semiconductor memory device practiced as a first embodiment of the invention.

The preferred embodiments of the invention will now be described with reference to the accompanying drawings. Throughout the drawings, like reference characters designate like or corresponding parts.

[First Embodiment]

FIG. 1 is an overall block diagram of a semiconductor memory device practiced as the first embodiment of the invention capable of operating in burst mode. Referring to FIG. 1, the first embodiment comprises a memory cell array 10, a row decoder 12, a bit line precharging circuit 14, a sense amplifier and write driver train 16, a bidirectional transfer bus group 17, an input/output register train 18, a bidirectional transfer bus group 19, and an input/output bus group 20.

The memory cell array 10 includes a plurality of word lines WL1 through WLx, a plurality of word line pairs BL1, /BL1 through BL4m, /BL4m intersecting these word lines, and a plurality of memory cells SMC furnished at the points of intersection between the word lines and the bit line pairs. That is, the memory cells SMC are arranged in the form of a matrix made of rows and columns.

Figure 2:
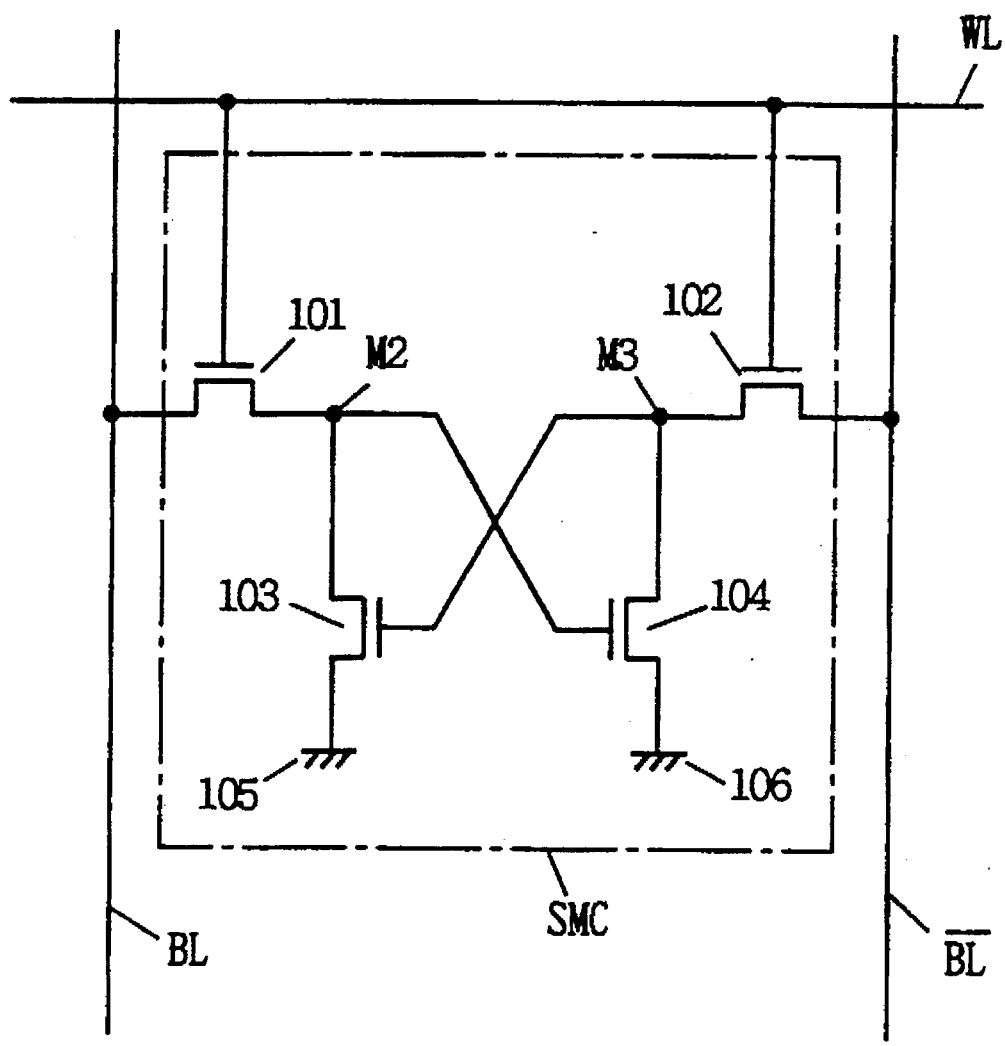
FIG. 2 is a circuit diagram of one memory cell of the semiconductor memory device shown in FIG. 1.
Figure 24:
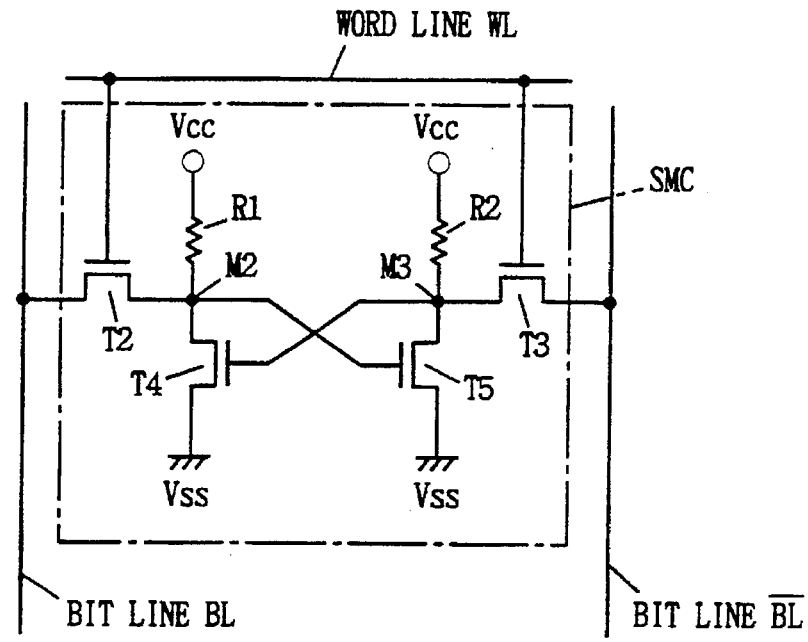
FIG. 24 is a circuit diagram of a static memory cell in an SRAM.
Figure 25:
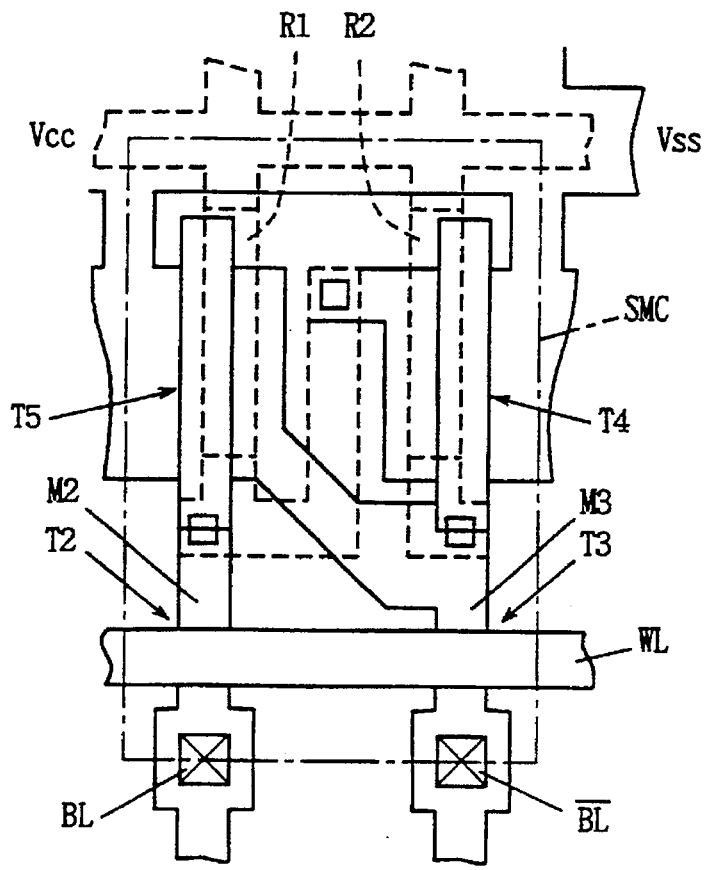
FIG. 25 is a plan view of the memory cell structure in FIG. 24.
Figure 26:
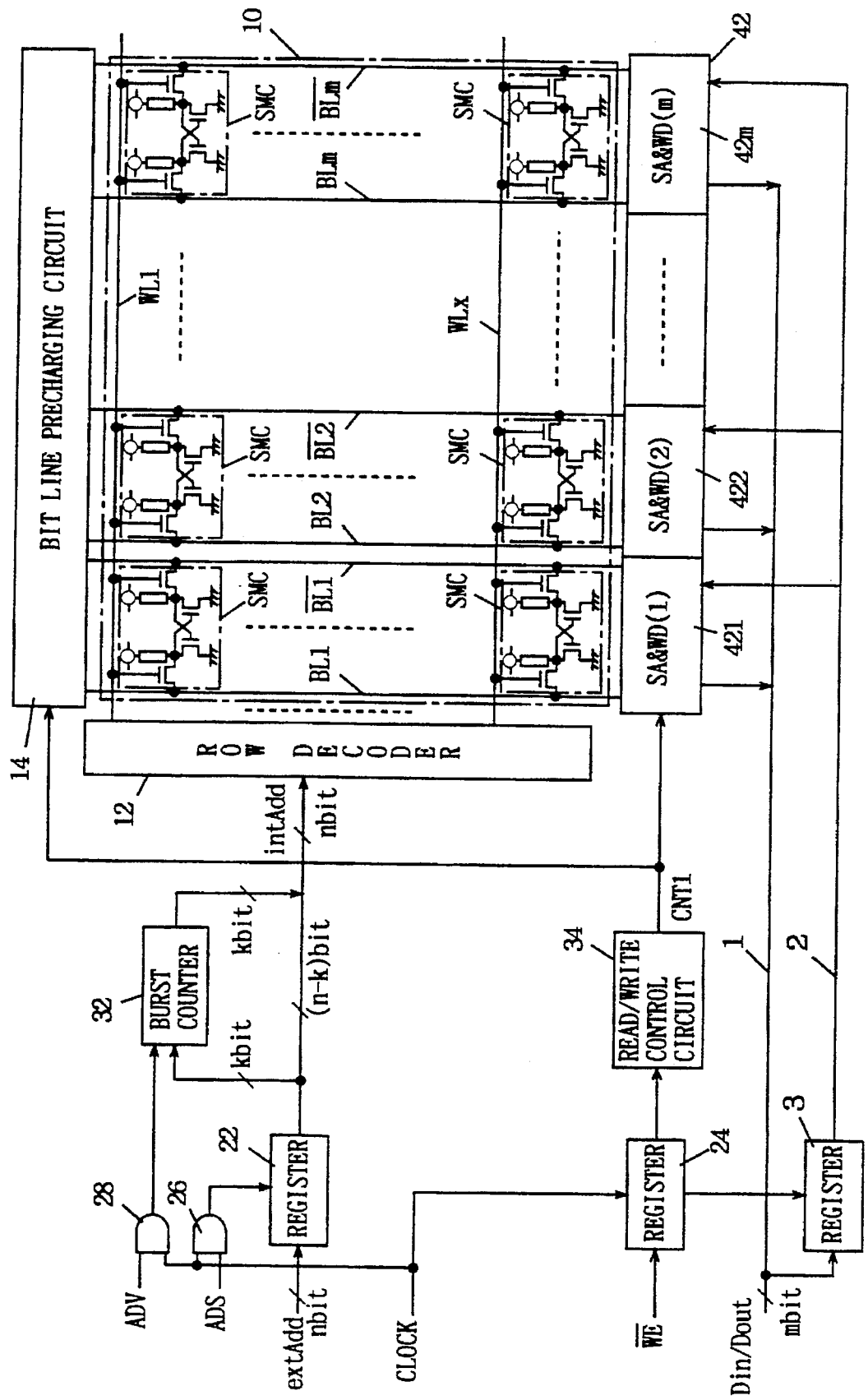
FIG. 26 is a block diagram of a typical conventional SRAM capable of operating in burst mode.
Figure 27:
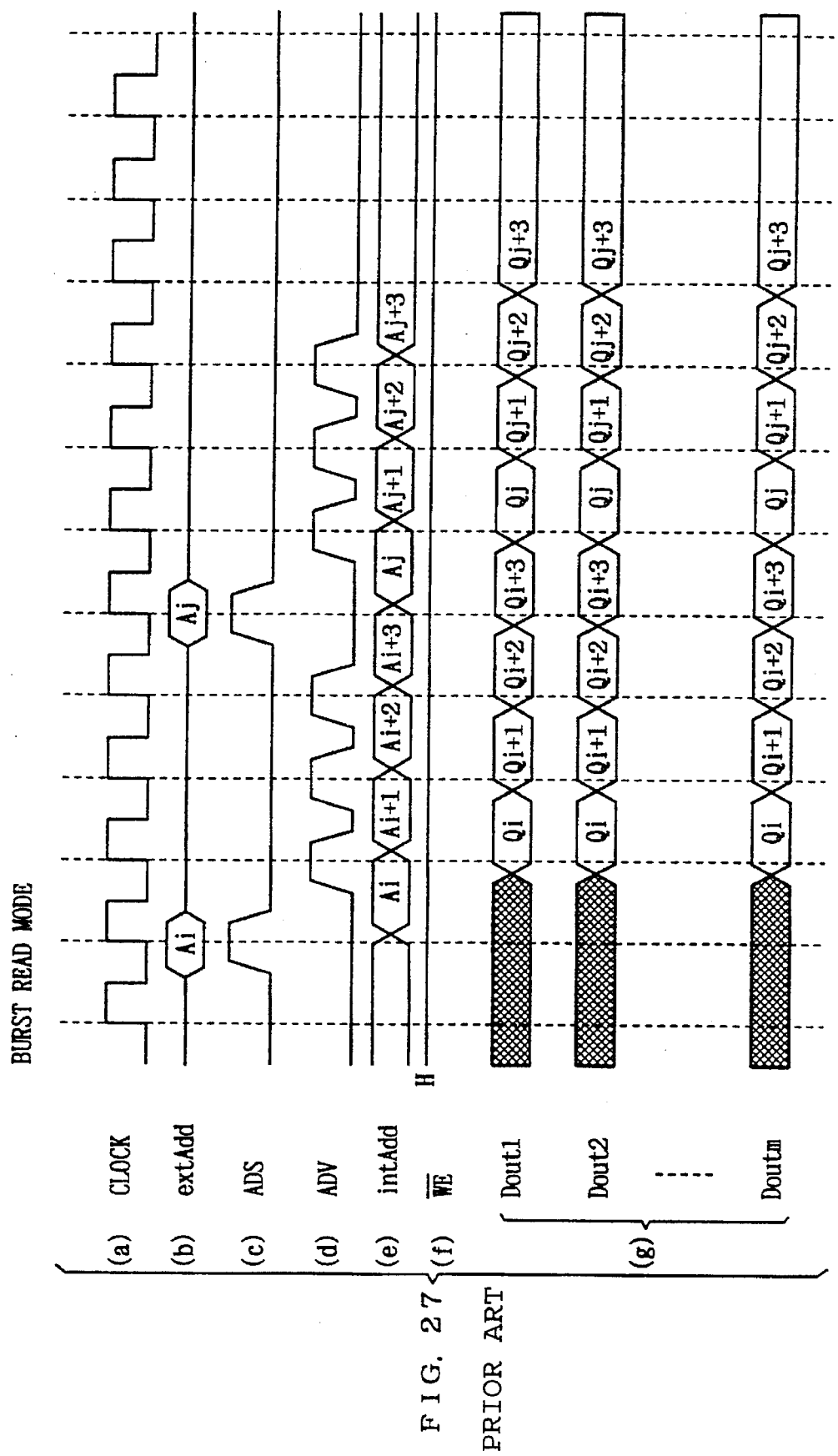
FIG. 27 is a timing chart of signals in effect when the SRAM of FIG. 26 operates in burst read mode.
Figure 28:
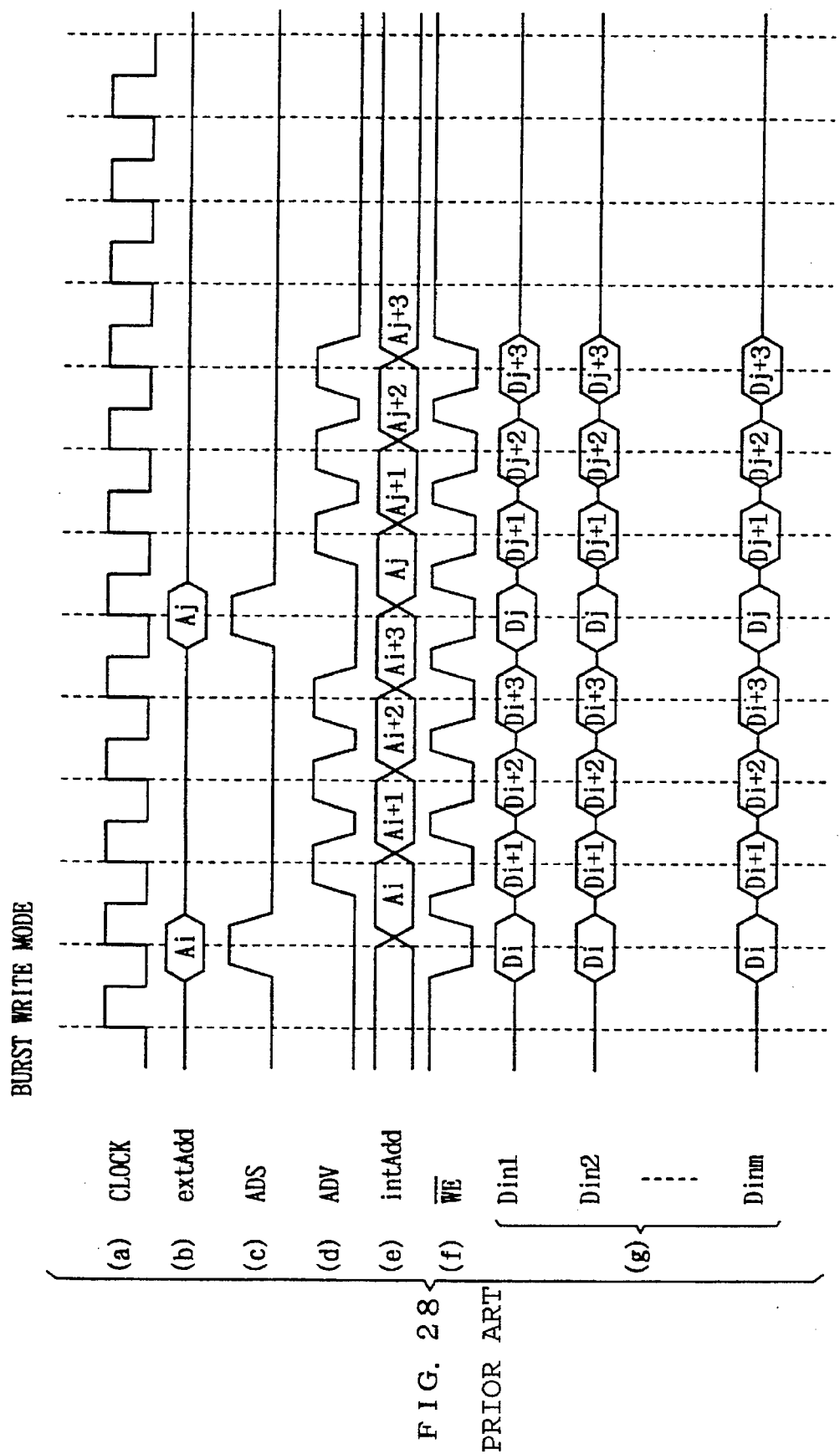
FIG. 28 is a timing chart of signals in effect when the SRAM of FIG. 26 operates in burst write mode.
Figure 29:
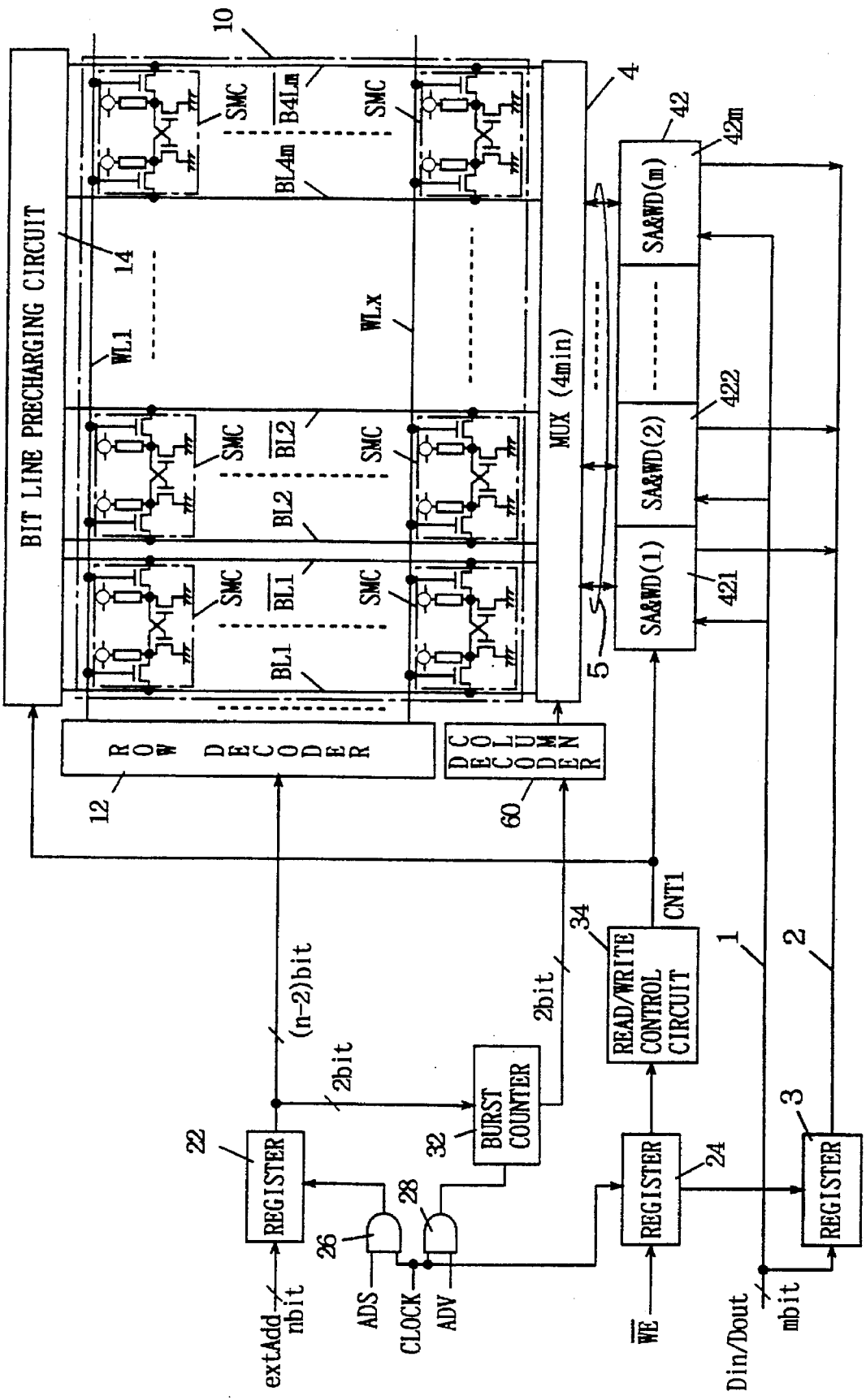
FIG. 29 is a block diagram of another conventional SRAM capable of operating in burst mode.

FIG. 2 is a circuit diagram of one memory cell SMC in the first embodiment. Referring to FIG. 2, the memory cell SMC comprises access transistors 101 and 102, and driver transistors 103 and 104. The access transistor 101 is connected interposingly between the corresponding bit line BL and a memory node M2. The gate electrode of the access transistor 101 is connected to the corresponding word line WL. The access transistor 102 is connected interposingly between the corresponding bit line /BL and a memory node M3. The gate electrode of the access transistor 102 is connected to the corresponding word line WL. The driver transistor 103 is connected interposingly between the memory node M2 and a grounding node 105, and has its gate electrode connected to the memory node M3. The driver transistor 104 is connected interposingly between the memory node M3 and a grounding node 106, and has its gate electrode connected to the memory node M2. Unlike the static memory cell SMC of FIG. 24, the memory cell SMC of FIG. 2 does not include high resistance R1 or R2. Such a no-load SRAM type memory cell SMC retains data therein by making use of the parasitic capacities of the memory nodes M2 and M3. This means that the memory cell SMC is incapable of retaining data statically.

In a write operation to the memory cell SMC, suppose that the potential of the bit line BL is High and that of the bit line /BL is Low. In that case, driving the word line WL High causes the access transistors 101 and 102 to conduct. This in turn transmits the potential of the bit line BL to the memory node M2 via the access transistor 101 and the potential of the bit line /BL to the memory node M3 via the access transistor 102. Thus the parasitic capacity of the memory node M2 is charged up to the high potential level. On the other hand, the parasitic capacity of the memory node M3 is discharged, bringing the memory node M3 Low. In this manner, the no-load SRAM type memory cell SMC can store one-bit data. Because this memory cell SMC is of SRAM type, the speed of writing data thereto is higher than that for the memory cell DMC of FIG. 22.

In a read operation from the memory SMC, suppose that the high-level and low-level charges are accumulated in the memory nodes M2 and M3, respectively. In that case, driving the word line WL High causes the access transistors 101 and 102 to conduct. This transmits the potential of the memory node M2 to the bit line BL via the access transistor 101 and the potential of the memory node M3 to the bit line /BL via the access transistor 102. As a result, complementary potential levels appear on the bit line pair BL1, /BL1 representing one-bit data. In the memory cell SMC, the data is held by the parasitic capacities of the memory nodes M2 and M3 and thus dissipates over time. To retain the data requires having the memory cell SMC refreshed periodically.

Referring again to FIG. 1, the row decoder 12 selects one of the word lines WL1 through WLx by decoding the internal address signal intAdd. The bit line precharging circuit 14 precharges all bit line pairs BL1, /BL1 through BL4m, /BL4m.

The sense amplifier and write driver train 16 is composed of 4m of sense amplifiers and write drivers 161 through 164m corresponding to the bit line pairs BL1, /BL through BL4m, /BL4m. In a read operation, each sense amplifier amplifies the potential difference that appears across the corresponding bit line pair. In a write operation, each write driver amplifies the data to be fed to the corresponding bit line pair.

The input/output register train 18 is made up of 4m of input/output registers 181 through 184m corresponding to the sense amplifiers and write drivers 161 through 164m. In a read operation, each input/output register stores the data amplified by the corresponding sense amplifier. In a write operation, each input/output register stores the data to be amplified by the corresponding write driver. The bidirectional transfer bus group 17 comprises 4m of bidirectional transfer buses 171 through 174m. Each bidirectional transfer bus transfer data bidirectionally between the corresponding sense amplifier or write driver and the corresponding input/output register.

The input/output bus group 20 is composed of four input/output buses 201 through 204. Each input/output bus is capable of transmitting m-bit data. The bidirectional transfer bus group 19 includes 4m of bidirectional transfer buses 191 through 194m. Each bidirectional transfer bus transfers data bidirectionally between the corresponding input/output register and an input/output bus. Specifically, the bidirectional transfer buses 191, 195, . . . , 194m-3 transfer m-bit data simultaneously between the input/output registers 181, 185, . . . , 184m-3 and the input/output bus 201; the bidirectional transfer buses 192, 196, . . . , 194m-2 transfer m-bit data simultaneously between the input/output registers 182, 186, . . . , 184m-2 and the input/output bus 202; the bidirectional transfer buses 193, 197, . . . , 194m-1 transfer m-bit data simultaneously between the input/output registers 183, 187, . . . , 184m-1 and the input/output bus 203; and the bidirectional transfer buses 194, 198, . . . , 194m transfer m-bit data simultaneously between the input/output registers 184, 188, . . . , 184m and the input/output bus 204.

The semiconductor memory device in the first embodiment further comprises an address register 22, a write control register 24, AND gates 26 and 28, multiplexers (MUX) 30 and 40, a burst counter 32, and a read/write control circuit 34.

The address register 22 accepts an externally supplied n-bit address extAdd in response to an address strobe signal ADS and a clock signal CLOCK fed through the AND gate 26. In accordance with the clock signal CLOCK, the write control register 24 accepts an externally supplied write enable signal /WE. Given the write enable signal /WE, the read/write control circuit 34 generates a control signal CNT1 and sends it to the bit line precharging circuit 14, to the sense amplifier and write driver train 16 and to the input/output register 18. Upon receipt of the advance signal ADV and clock signal CLOCK via the AND gate 28, the burst counter 32 accepts two bits out of the n-bit external address signal extAdd from the address register 22. Supplied with the two-bit address signal, the burst counter 32 generates a selection signal SEL and gives it to the multiplexer 40. When receiving the selection signal SEL, the multiplexer 40 selects one of the four input/output buses 201 through 204 for data input or output over the selected bus. The address signal composed of the remaining bits (n−2) from the address register 22 is supplied to the multiplexer 30.

The semiconductor memory device in the first embodiment further comprises a refresh control circuit 36 and a refresh counter 38. In response to a control signal CNT2 from the read/write control circuit 34, the refresh control circuit 36 generates a refresh enable signal REFE and sends it to the refresh counter 38, to the multiplexer 30 and to the read/write control circuit 34. Given the refresh enable signal REFE, the refresh counter 38 generates an (n−2)-bit refresh address signal refAdd successively. The refresh address signal refAdd is fed to the multiplexer 30. When the refresh enable signal REFE is at the low level, the multiplexer 30 feeds the (n−2)-bit external address signal extAdd to the row decoder 12 as the internal address signal intAdd. When the refresh enable signal REFE is High, the multiplexer 30 supplies the row decoder 12 with the (n−2)-bit refresh address signal refAdd as the internal address signal intAdd.

(1) Burst read mode

How the first embodiment operates in burst read mode will now be described with reference to the timing chart of FIG. 3. When the clock signal CLOCK (waveform (a) in FIG. 3) rises while the address strobe signal ADS (waveform (c)) is at the high level, the n-bit external address signal Ai (waveform (b)) is accepted into the address register 22. Of the n bits making up the external address signal Ai, two bits are sent to the burst counter 32. The remaining (n−2) bits are fed via the multiplexer 30 to the row decoder 12 as the internal address signal Ai (waveform (e)). The row decoder 12 decodes the received internal address signal Ai and selects one of the word lines WL1 through WLx accordingly. When the i-th word line WLi corresponding to the internal address signal Ai is selected, the potential of the word line WLi is driven High (waveform (f)) as illustrated in FIG. 3.

Driving the word line WLi High causes the access transistors 101 and 102 to conduct in all memory cells SMC connected to the word line WLi. This in turn transmits the potential of the memory node M2 in each memory cell SMC to the corresponding bit line via the access transistor 101, and sends the potential of the memory node M3 to the corresponding bit line via the access transistor 102. As a result, a potential difference appears across each bit line pair and is amplified by the corresponding sense amplifier. This brings one of the two bit lines constituting each pair High and the other Low. In this manner, the data in all memory cells SMC connected to the selected word line are latched by the sense amplifiers 161 through 164m.

The data latched by the sense amplifiers 161 through 164m are transferred to the input/output registers 181 through 184m respectively via the bidirectional transfer buses 171 through 174m. With the data placed in the input/output registers 181 through 184m, the word line WLi is brought Low (waveform (f)) as depicted in FIG. 3.

Figure 3:
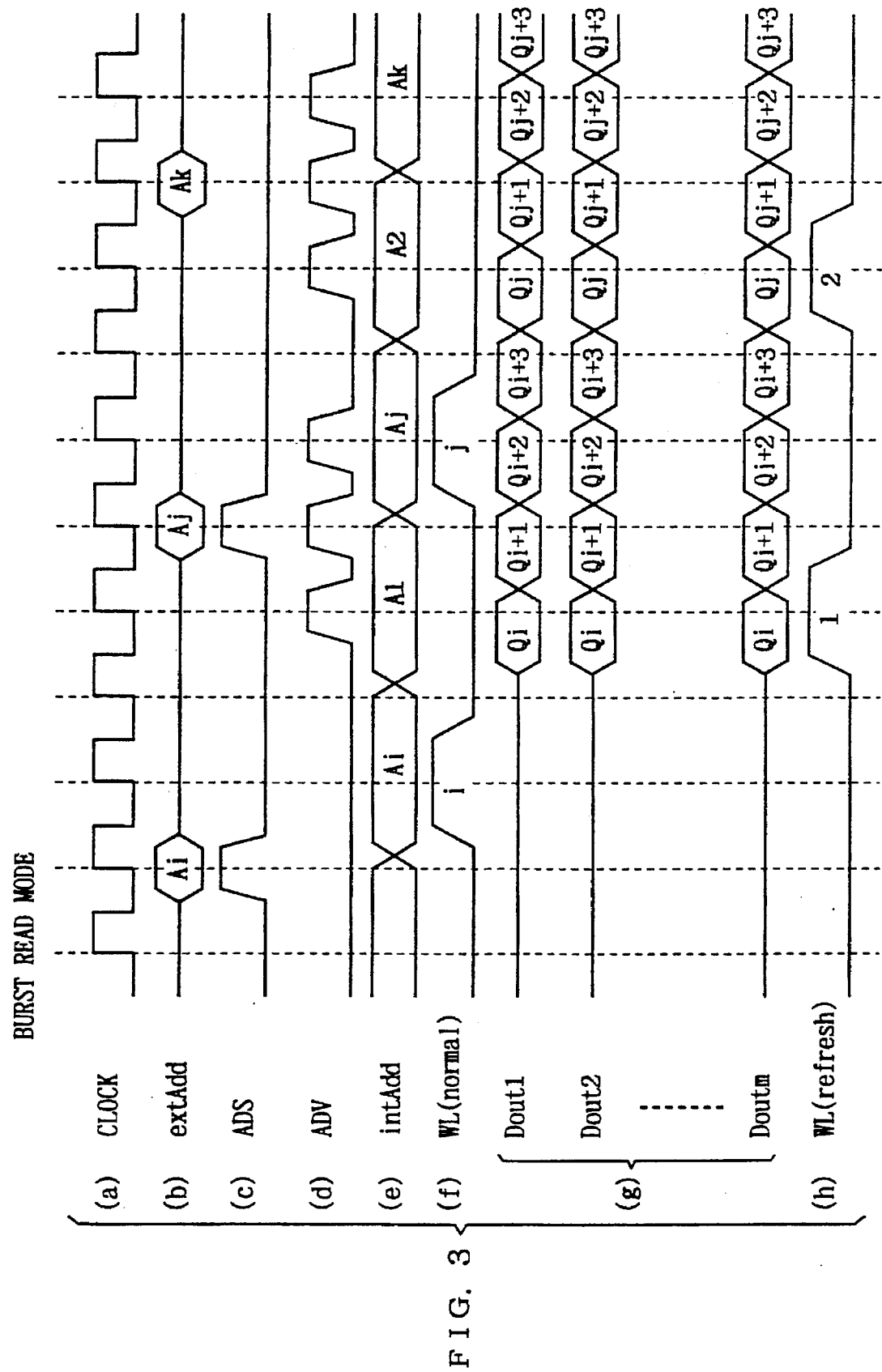
FIG. 3 is a timing chart of signals in effect when the semiconductor memory device shown in FIG. 1 operates in burst read mode.

When the clock signal CLOCK (waveform (a) in FIG. 3) rises while the advance signal ADV (waveform (d)) is at the high level, the address signal in the burst counter 32 is incremented. In this example, the content of the burst counter 32 is incremented three times because three consecutive advance signals ADV are supplied. This causes the burst counter 32 to feed the multiplexer 40 with four selection signals SEL successively. In response to the first selection signal SEL, the multiplexer 40 selects the input/output bus 201. This allows the data in the input/output registers 181, 185, . . . , 184m-3 to be transferred to the input/output bus 201 via the bidirectional transfer buses 191, 195, . . . , 194m-3 respectively. The m-bit data Qi placed onto the input/output bus 201 is output through the multiplexer 40.

Responding to the next selection signal SEL, the multiplexer 40 selects the input/output bus 202 in place of the input/output bus 201. The data in the input/output registers 182, 186, ..., 184m-2 are transferred to the input/output bus 202 via the bidirectional transfer buses 192, 196, ..., 194m-2 respectively. The m-bit data Qi+1 placed onto the input/output bus 202 is output through the multiplexer 40. Then responding further to the next selection signal SEL, the multiplexer 40 selects the input/output bus 203 in place of the input/output bus 202. The data in the input/output registers 183, 187, ..., 184m-1 are transferred to the input/output bus 202. The m-bit data Qi+2 placed onto the input/output bus 203 is output via the multiplexer 40. In response to the last selection signal SEL, the multiplexer 40 selects the input/output bus 204 in place of the input/output bus 203. The data in the input/output registers 184, 188, ..., 184m are transferred to the input/output bus 204. The m-bit data Qi+3 placed onto the input/output bus 204 is output through the multiplexer 40.

Meanwhile, after the external address signal Ai is sent from the address register 22 to the row decoder 12 through the multiplexer 30, the refresh control circuit 36 generates a high-level refresh enable signal REFE and gives it to the refresh counter 38 and multiplexer 30. Responding to the refresh enable signal REFE, the refresh counter 38 generates an (n−2)-bit refresh address signal A1 and sends it to the row decoder 12 as the internal address signal intAdd by way of the multiplexer 30. The row decoder 12 decodes the received internal address signal A1 and selects one of the word lines WL1 through WLx accordingly. In this example, the first word line WL1 (waveform (h) in FIG. 3) corresponding to the internal address signal A1 is brought High. This refreshes all memory cells SMC connected to the selected word line WL1. At this point, the potential of the word line WLi is already at the low level, so that the data in the memory cells SMC connected to the word line WLi are not destroyed. Because the driver transistors 103 and 104 are cross-coupled in the memory cells SMC, simply driving a given word line High refreshes all memory cells SMC connected to that word line.

When the external address signal Aj (waveform (b) in FIG. 3) is admitted next, the word line WLj corresponding to the external address signal Aj is driven High (waveform (f)). This latches into the input/output registers 181 through 184m the data of all memory cells SMC connected to the word line WLj. Thereafter, of these 4m bits of data, the first m bits of data Qj (waveform (g)) are output via the input/output bus 201 and multiplexer 40. The first m bits of data Qj are followed by the next m bits of data Qj+1 which are output via the input/output bus 202 and multiplexer 40. The m bits of data Qj+1 are then followed by the next m bits of data Qj+2 which are output through the input/output bus 203 and multiplexer 40. Finally, the remaining m bits of data Qj+3 out of the 4m-bit data are output via the input/output bus 204 and multiplexer 40.

After the internal address signal Aj (waveform (e) in FIG. 3) is given from the address register 22 to the row decoder 12, the refresh counter 38 sends a refresh address signal A2 to the row decoder 12. This drives High the word line WL2 (waveform (h)) corresponding to the refresh address signal A2. As a result, all memory cells SMC connected to the word line WL2 are refreshed.

As described, while data are read successively from memory cells SMC connected to a single word line in burst mode, all memory cells SMC connected to the word line are refreshed. This eliminates the need for carrying out a refresh operation between two separate burst operations. That is, the burst operation is allowed to be continuous.

(2) Burst write mode

Figure 4:
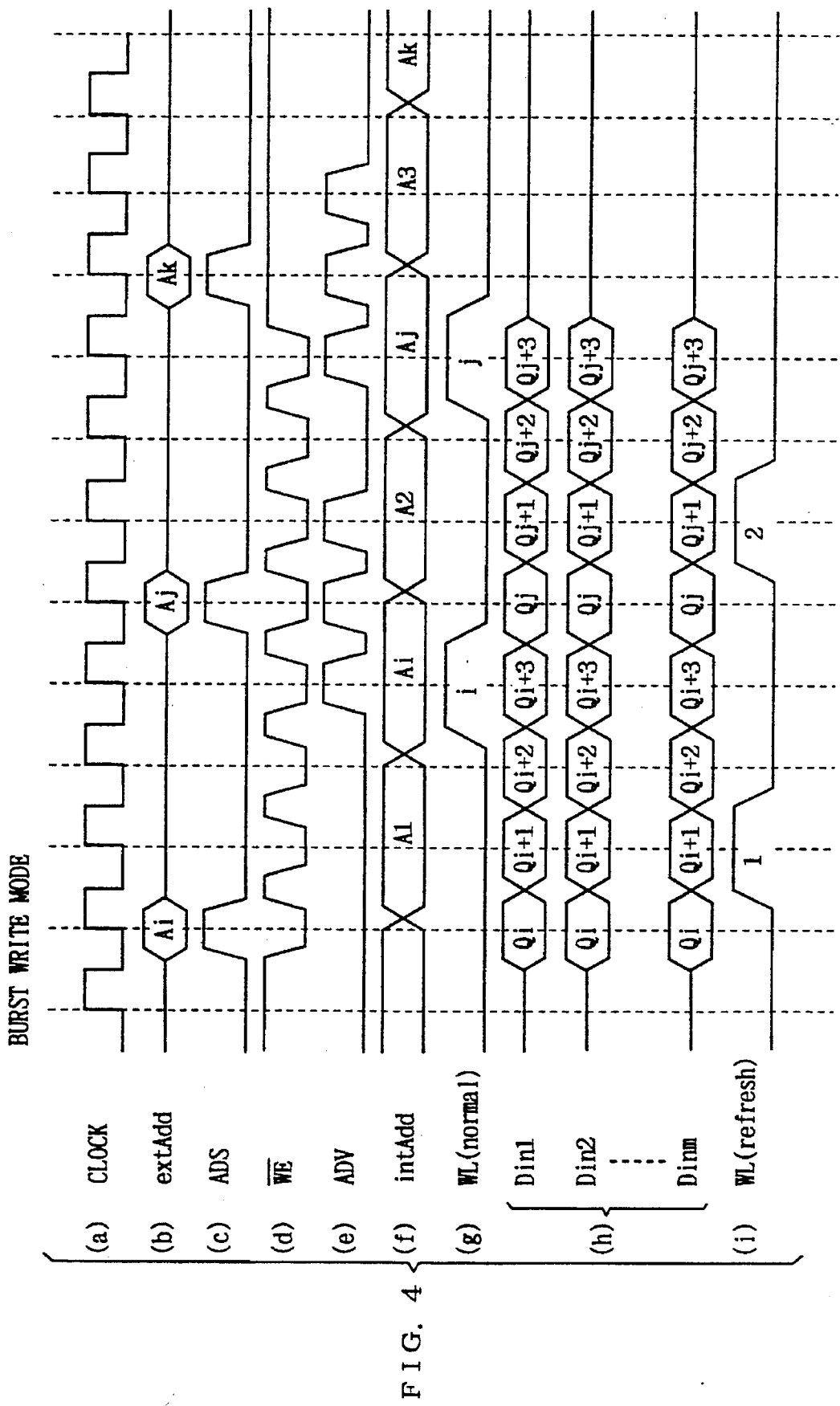
FIG. 4 is a timing chart of signals in effect when the semiconductor memory device shown in FIG. 1 operates in burst write mode.

How the first embodiment operates in burst write mode will now be described with reference to the timing chart of FIG. 4. As shown in FIG. 4, the m-bit data Qi (waveform (h)) initially supplied from the outside is placed into the input/output registers 181, 185, ..., 184m-3 via the multiplexer 40, input/output bus 201 and bidirectional transfer buses 191, 195, ..., 194m-3. The m-bit data Qi+1 supplied next from the outside is placed into the input/output registers 182, 186, ..., 184m-2 via the multiplexer 40, input/output bus 202 and bidirectional transfer buses 192, 196, ..., 194m-2. The data Qi+1 is followed by the m-bit data Qi+2 supplied thereafter from the outside and is placed into the input/output registers 183, 187, ..., 184m-1 via the multiplexer 40, input/output bus 203 and bidirectional transfer buses 193, 197, ..., 194m-1. Finally, the m-bit data Qi+3 is supplied externally and placed into the input/output registers 184, 188, ..., 184m via the multiplexer 40, input/output bus 204 and bidirectional transfer buses 194, 198, ..., 194m. The data Qi through Qi+3 are set to the input/output registers in accordance with the low-level write enable signal /WE (waveform (d)) as illustrated in FIG. 4.

In response to the external address signal Ai (waveform (b) in FIG. 4), the potential of one word line WLi is brought High (waveform (i)). This causes the write drivers 161 through 164m to amplify the 4m-bit data held in the input/output registers 181 through 184m and to write the amplified data to all memory cells SMC connected to the word line WLi.

While the externally supplied data Qi through Qi+3 are being placed into the input/output registers 181 through 184m, the refresh counter 38 feeds the refresh address signal A1 (waveform (f) in FIG. 4) to the row decoder 12. This drives the word line WL1 High (waveform (i)). Consequently, all memory cells SMC connected to the word line WL1 are refreshed.

Next time the externally supplied data Qi through Qi+3 are being placed into the input/output registers 181 through 184m, the refresh counter 38 sends the refresh address signal A2 to the row decoder 12. This brings High the word line WL2 corresponding to the refresh address signal A2. This refreshes all memory cells SMC connected to the word line WL2.

In this manner, while 4m-bit data are set consecutively to the input/output register train 18, all memory cells connected to one word line are refreshed. This eliminates the need for carrying out a refresh operation between two separate burst write operations. That is, the burst write operation is allowed to be performed continuously.

The first embodiment permits continuous burst operation because the memory is capable of having its memory cells refreshed in burst read/write mode. With the read/write data accommodated temporarily in the input/output registers, there is no possibility of the data being destroyed by a refresh operation in burst mode. Each of all word lines WL1 through WLx is selected successively for a refresh operation starting from the word line WL1. This means that all memory cells SMC are refreshed evenly. Because the memory cells SMC have no high resistance, they occupy a smaller layout area than high-resistance load type static memory cells. That is, the memory cells SMC of the first embodiment may constitute a semiconductor memory device of an enhanced capacity. With the driver transistors 103 and 104 cross-coupled in each of the memory cells SMC, their access speed is higher than that of dynamic memory cells. The fact that simply driving a word line High refreshes all memory cells SMC connected thereto eliminates the need to operate sense amplifiers for a refresh operation. This ensures high-speed performance of the semiconductor memory device as a whole. Furthermore, the memory cells SMC include no load element, which makes it possible to curtail the comparable conventional fabrication process by 20 to 30 percent. This leads to a significant increase in yield and to appreciable reductions in manufacturing costs. As a result, the inventive semiconductor memory device provides a performance level equivalent to that of the SRAM and offers a greater memory capacity than the comparable SRAM.

[Second Embodiment]

Figure 5:
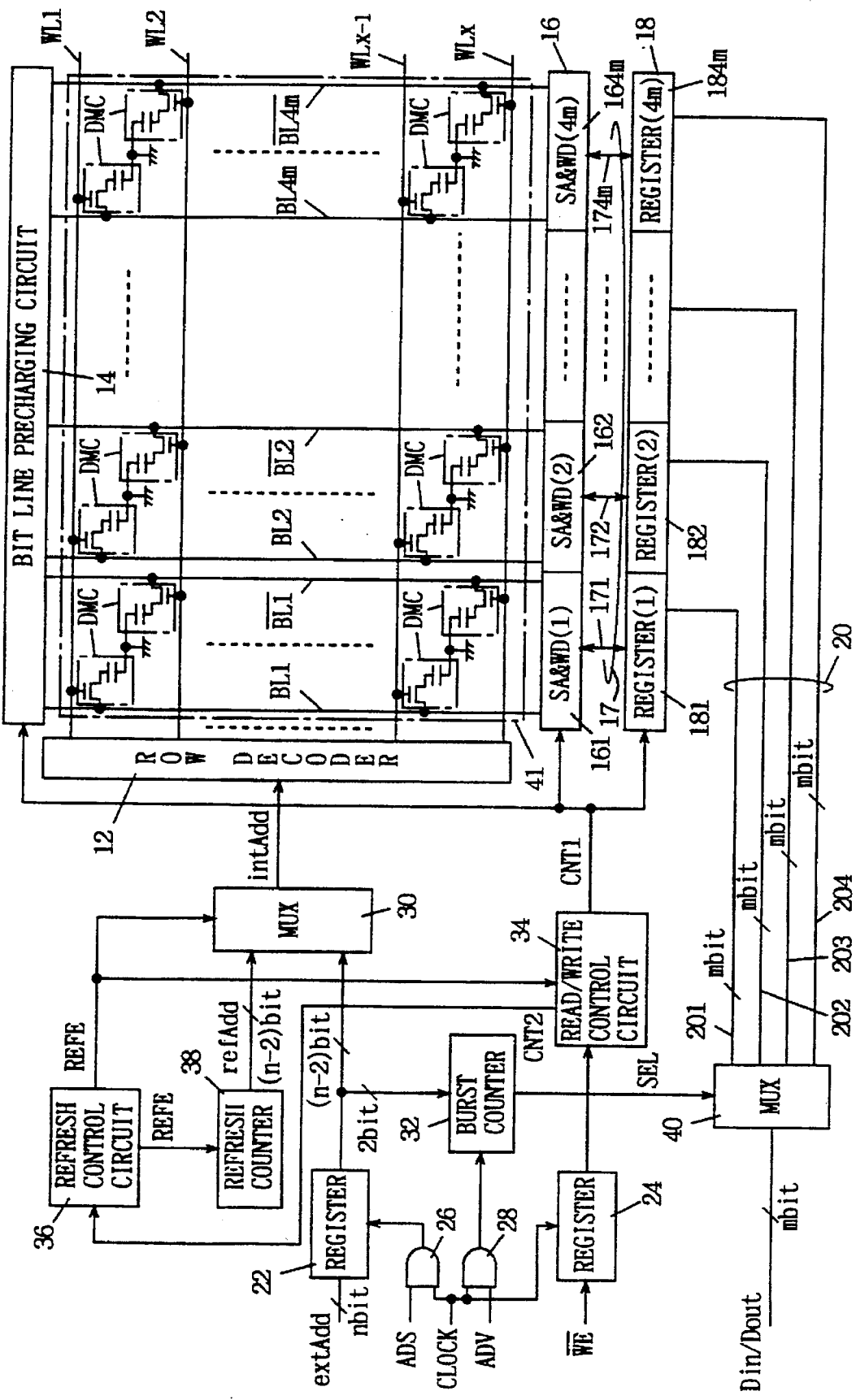
FIG. 5 is an overall block diagram of a semiconductor memory device practiced as a second embodiment of the invention.
Figure 22:
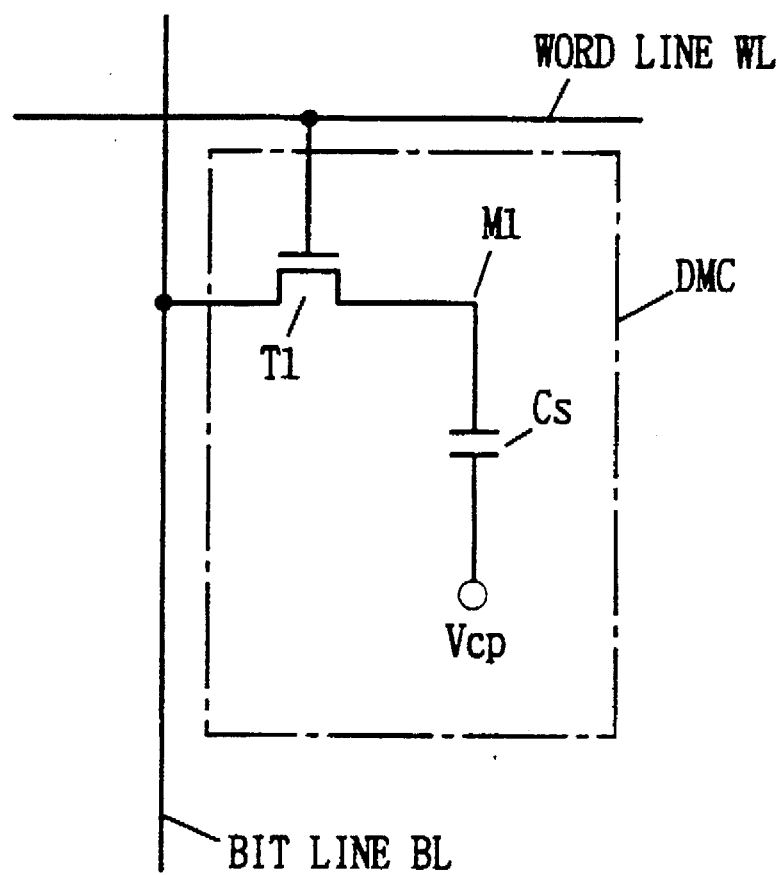
FIG. 22 is a circuit diagram of a memory cell in a DRAM.
Figure 23A:
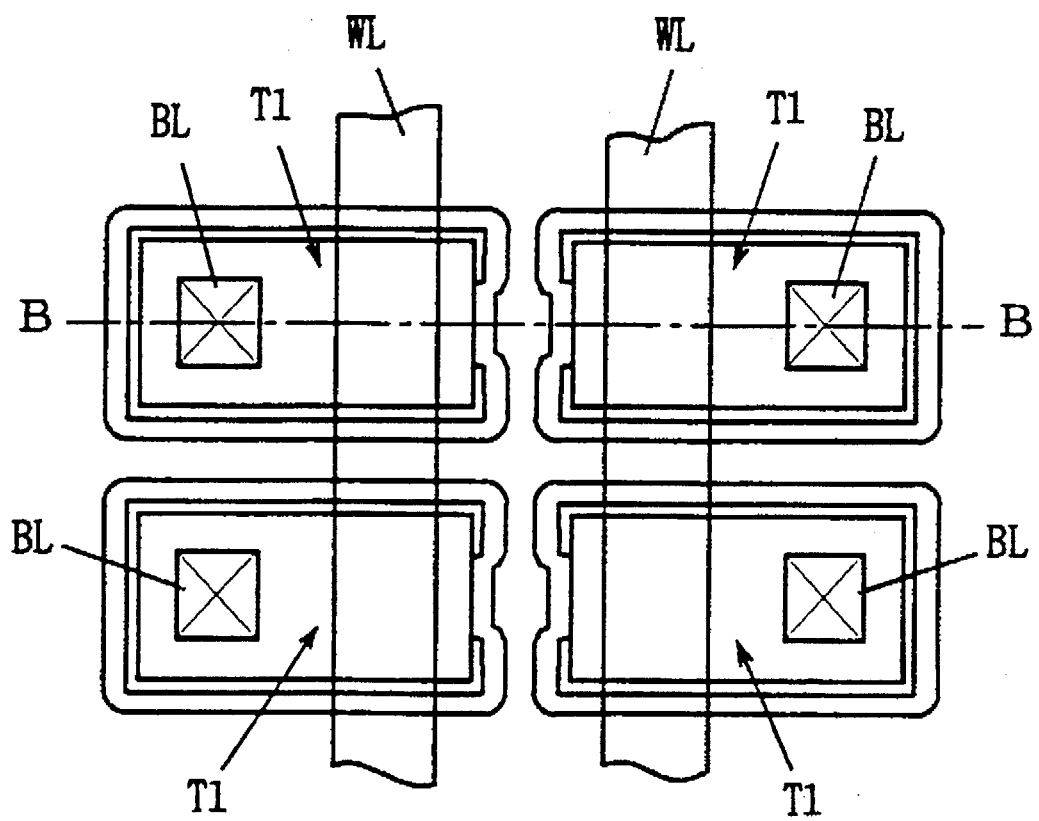
FIG. 23A is a plan view of the memory cell structure in FIG. 22.
Figure 23B:
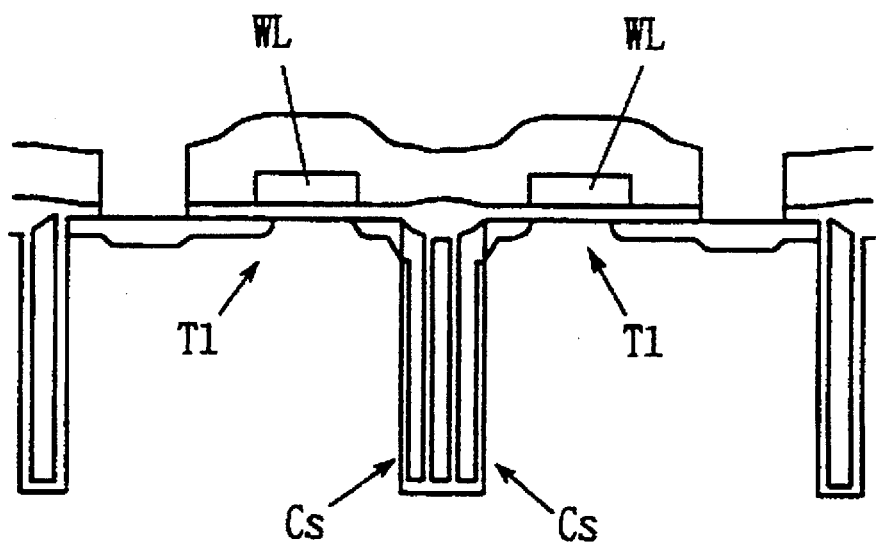
FIG. 23B is a cross-sectional view taken on line B—B in FIG. 23A.

FIG. 5 is an overall block diagram of a semiconductor memory device practiced as the second embodiment of the invention. Referring to FIG. 5, each of the memory cells DMC constituting the second embodiment has one access transistor and one cell capacitor, as opposed to the constitution of the first embodiment in FIG. 1. That is, each memory cell DMC of the second embodiment is identical to what is shown in FIG. 22.

(1) Burst read mode

Figure 6:
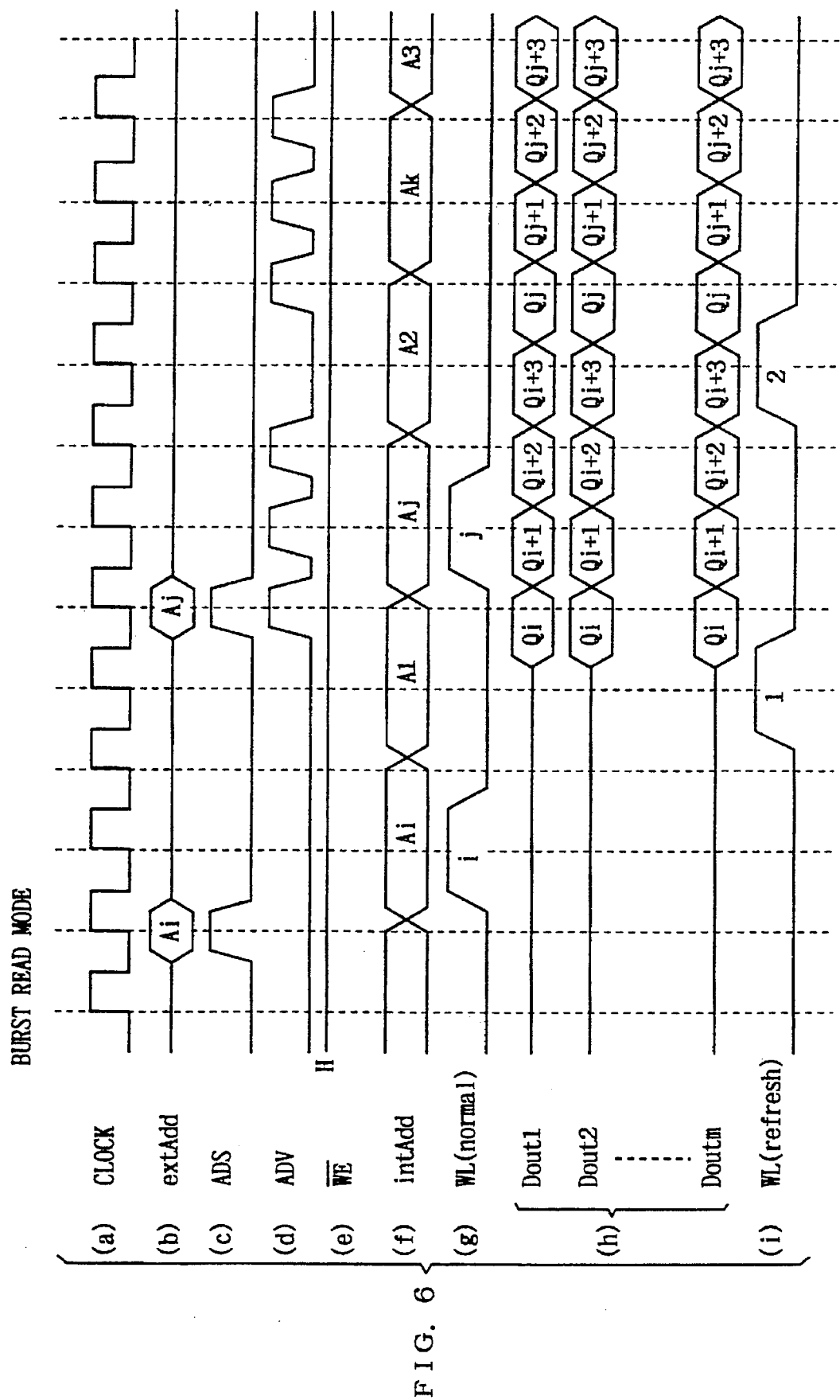
FIG. 6 is a timing chart of signals in effect when the semiconductor memory device shown in FIG. 5 operates in burst read mode.

How the second embodiment operates in burst read mode will now be described with reference to the timing chart of FIG. 6. In the second embodiment, the bit line precharging circuit 14 precharges all bit line pairs BL1, /BL1 through BL4m, /BL4m to an intermediate potential level Vcc/2 (Vcc represents the supply voltage) before data is read from any memory cells DMC. Then in response to an externally supplied address signal Ai, one word line WLi is selected. This causes data to be read from all memory cells DMC connected to the selected word line WLi. In each memory cell DMC, data is retained by a cell capacitor accumulating electrical charges therein. Thus when the access transistor conducts in a memory cell DMC, the charges are reallocated between the bit line and the cell capacitor. For example, where the cell capacitor is fully charged and the access transistor is allowed to conduct, the charge of the cell capacitor flows to the corresponding bit line. This slightly raises the potential of the bit line from the intermediate potential level. If the access transistor conducts where the cell capacitor is fully discharged, the charge of the corresponding bit line flows into the cell capacitor. This slightly lowers the potential of the bit line from the intermediate potential level (Vcc/2). Thus when a word line is selected, a potential difference appears across each of all bit line pairs BL1, /BL1 through BL4m, /BL4m. The potential difference across a given bit line pair is amplified by the corresponding sense amplifier. It follows that the period from the time the word line WLi is brought High until the time the first m-bit data Qi is output in the second embodiment is longer than the comparable period in the first embodiment, as shown by waveforms (g) and (h) in FIG. 6. What is described above is what makes the second embodiment different from the first embodiment operating in burst read mode. The other workings are the same between the two embodiments and thus will not be discussed further.

(2) Burst write mode

Figure 7:
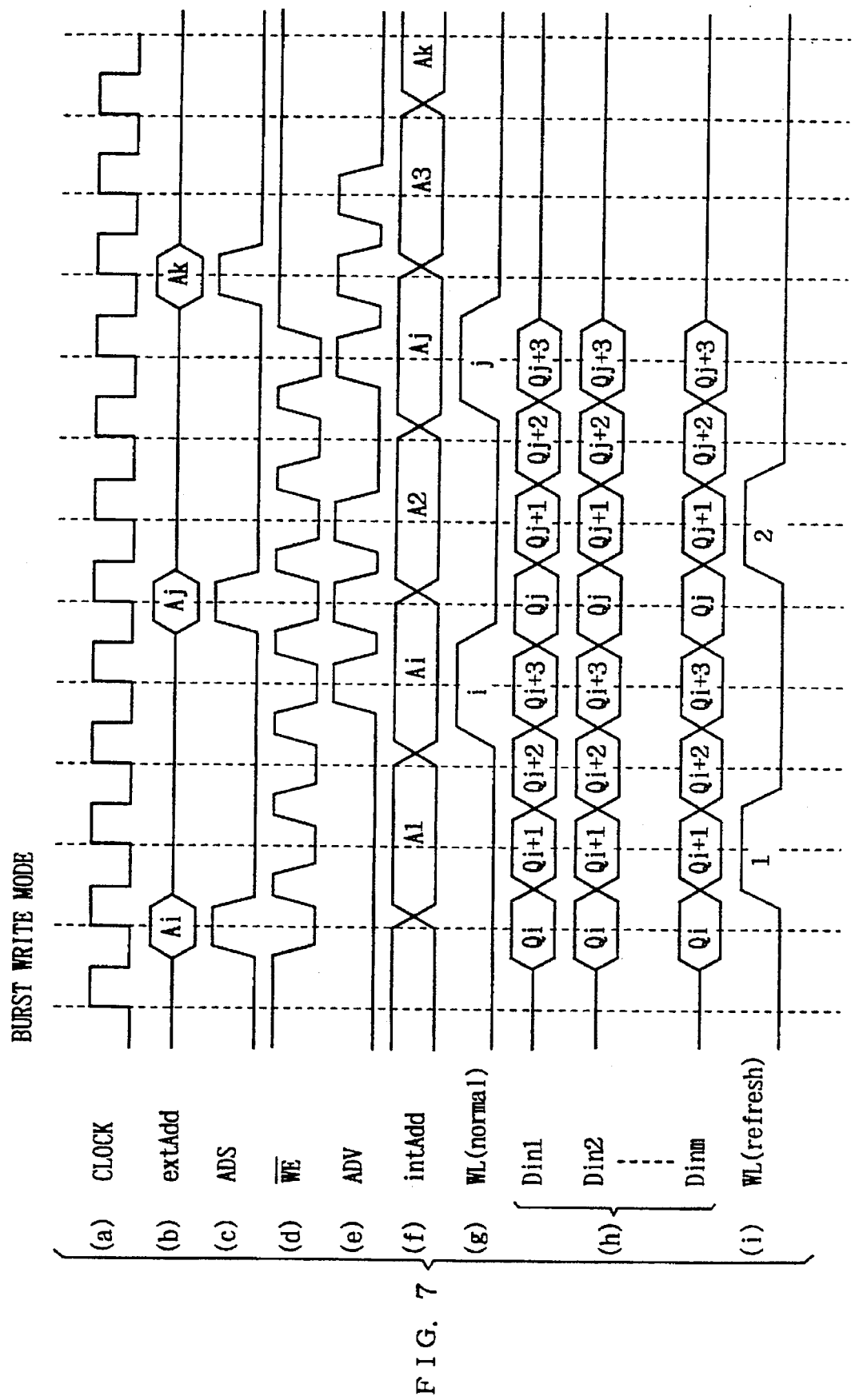
FIG. 7 is a timing chart of signals in effect when the semiconductor memory device shown in FIG. 5 operates in burst write mode.

FIG. 7 is a timing chart of signals in effect when the semiconductor memory device in the second embodiment operates in burst write mode. The workings of the second embodiment in its burst write mode are substantially the same as those of the first embodiment and will not be described further.

As with the first embodiment, the second embodiment permits refresh operation in its burst read/write mode. This feature allows the burst operation to be performed continuously. Because the second embodiment is composed of dynamic memory cells, the access speed of the second embodiment is lower than that of the first embodiment. In addition, power consumption is increased in the second embodiment because of its need to operate sense amplifiers during refresh operation. However, the component dynamic memory cells DMC occupy only a quarter of the area taken up by the comparable memory composed of static memory cells SMC. This makes it easier for the second embodiment to be implemented as a semiconductor memory device of large capacity. Furthermore, the cost of fabricating the second embodiment is approximately a quarter of what it takes to manufacture the first embodiment.

[Third Embodiment]

Figure 8:
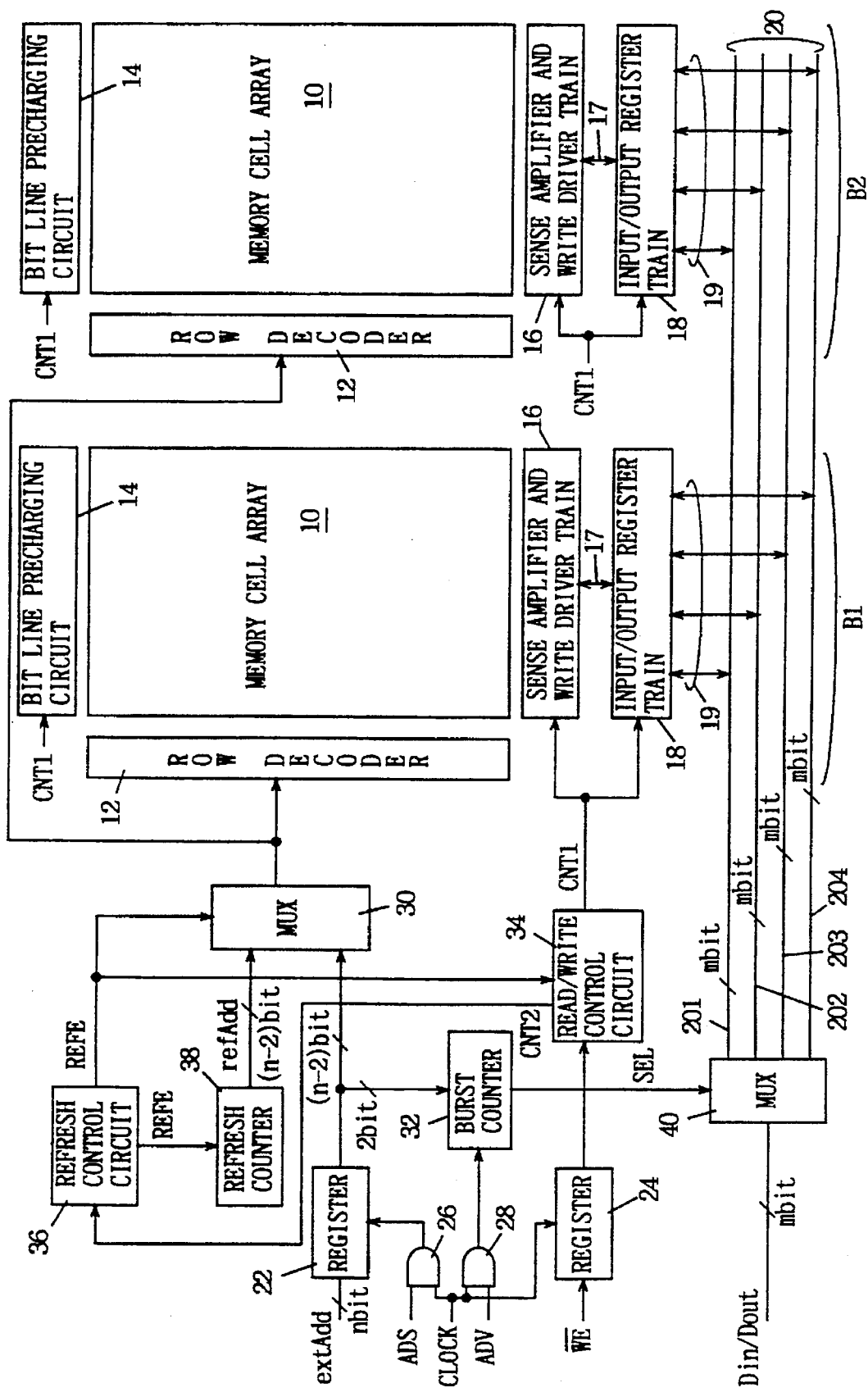
FIG. 8 is an overall block diagram of a semiconductor memory device practiced as a third embodiment of the invention.

FIG. 8 is an overall block diagram of a semiconductor memory device practiced as the third embodiment of the invention. The third embodiment is in fact a variation of the first embodiment divided into two blocks B1 and B2. Each block comprises a memory cell array 10, a row decoder 12, a bit line precharging circuit 14, a sense amplifier and write driver train 16, a bidirectional transfer bus group 17, an input/output register train 18 and a bidirectional transfer bus group 19. Each block functions in the same manner as the first embodiment.

The third embodiment divides the word lines into half the length of those in the first embodiment. This reduces the load carried by each of the word lines, with the result that the potential of any one word line is raised more quickly in the third embodiment than in the first embodiment. The same advantage is also obtained by dividing the bit lines into a plurality of portions.

[Fourth Embodiment]

Figure 9:
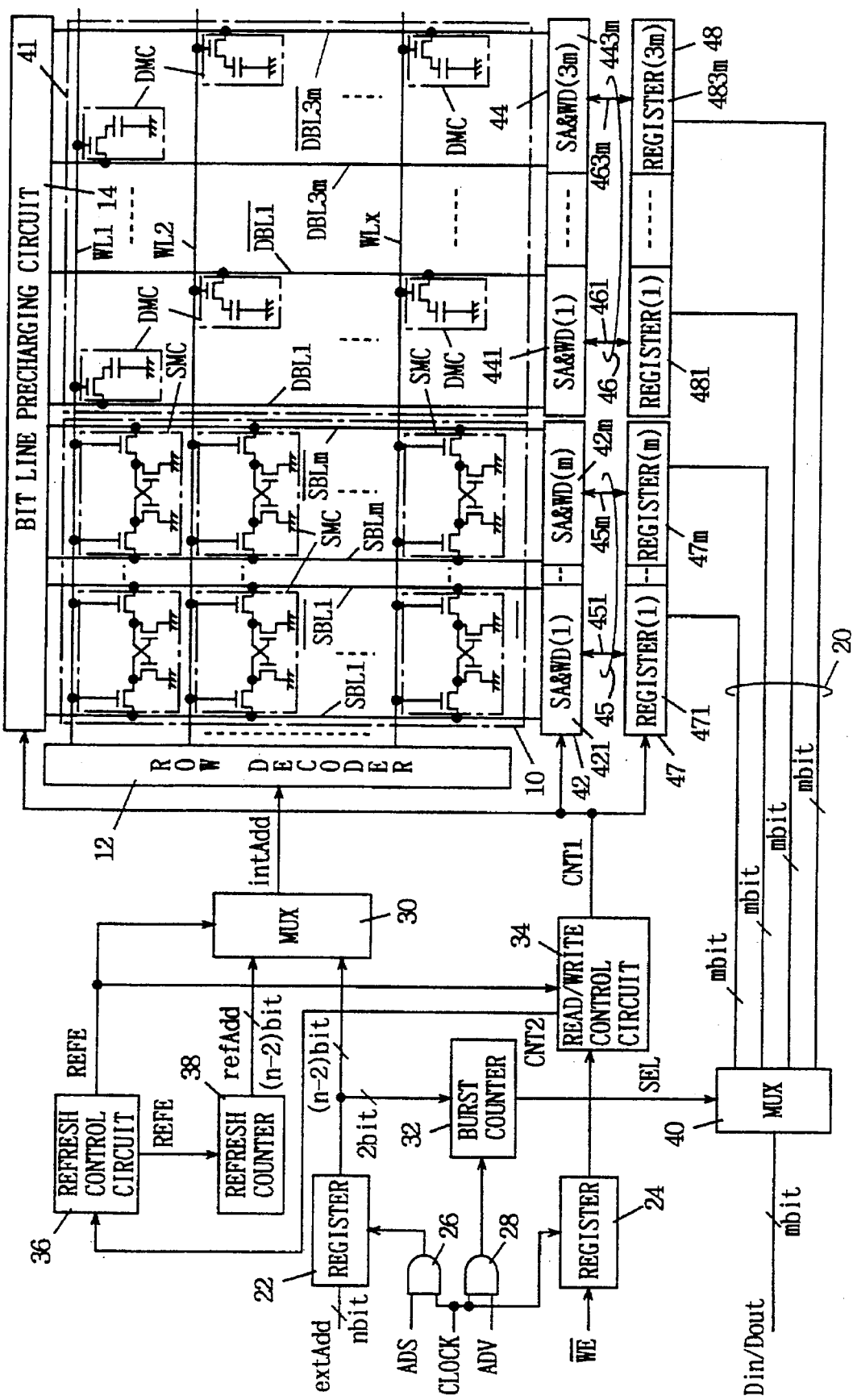
FIG. 9 is an overall block diagram of a semiconductor memory device practiced as a fourth embodiment of the invention.

FIG. 9 is an overall block diagram of a semiconductor memory device practiced as the fourth embodiment of the invention. Referring to FIG. 9, the fourth embodiment comprises a DRAM type memory cell array 41 and an SRAM type memory cell array 10. The memory cell array 41 includes 3m bit line pairs DBL1, /DBL1 through DBL3m, /DBL3m, while the memory cell array 10 has m bit line pairs SBL1, /SBL1 through SBLm, /SBLm.

An SRAM type sense amplifier and write driver train 42 is provided to match the memory cell array 10, and a DRAM type sense amplifier and write driver train 44 is furnished to correspond with the memory cell array 41. The sense amplifier and write driver train 42 is matched with an SRAM type input/output register 47, and the sense amplifier and write driver train 44 is supplemented with a DRAM type input/output register 48. The sense amplifier and write driver train 42 comprises m of sense amplifiers and write drivers 421 through 42m. The sense amplifier and write driver train 44 includes 3m of sense amplifiers and write drivers 441 through 443m. The input/output register 47 is composed of m of input/output registers 471 through 47m corresponding to the sense amplifiers and write drivers 421 through 42m. The input/output register 48 is made up of 3m of input/output registers 481 through 483m corresponding to the sense amplifiers and write drivers 441 through 443m.

Between the sense amplifier and write driver train 42, and the input/output register 47, there is provided a bidirectional transfer bus group 45 comprising m of bidirectional transfer buses 451 through 45m. Between the sense amplifier and write driver train 44, and the input/output register 48 is a bidirectional transfer bus group 46 including 3m of bidirectional transfer buses 461 through 463m.

(1) Burst read mode

Figure 10:
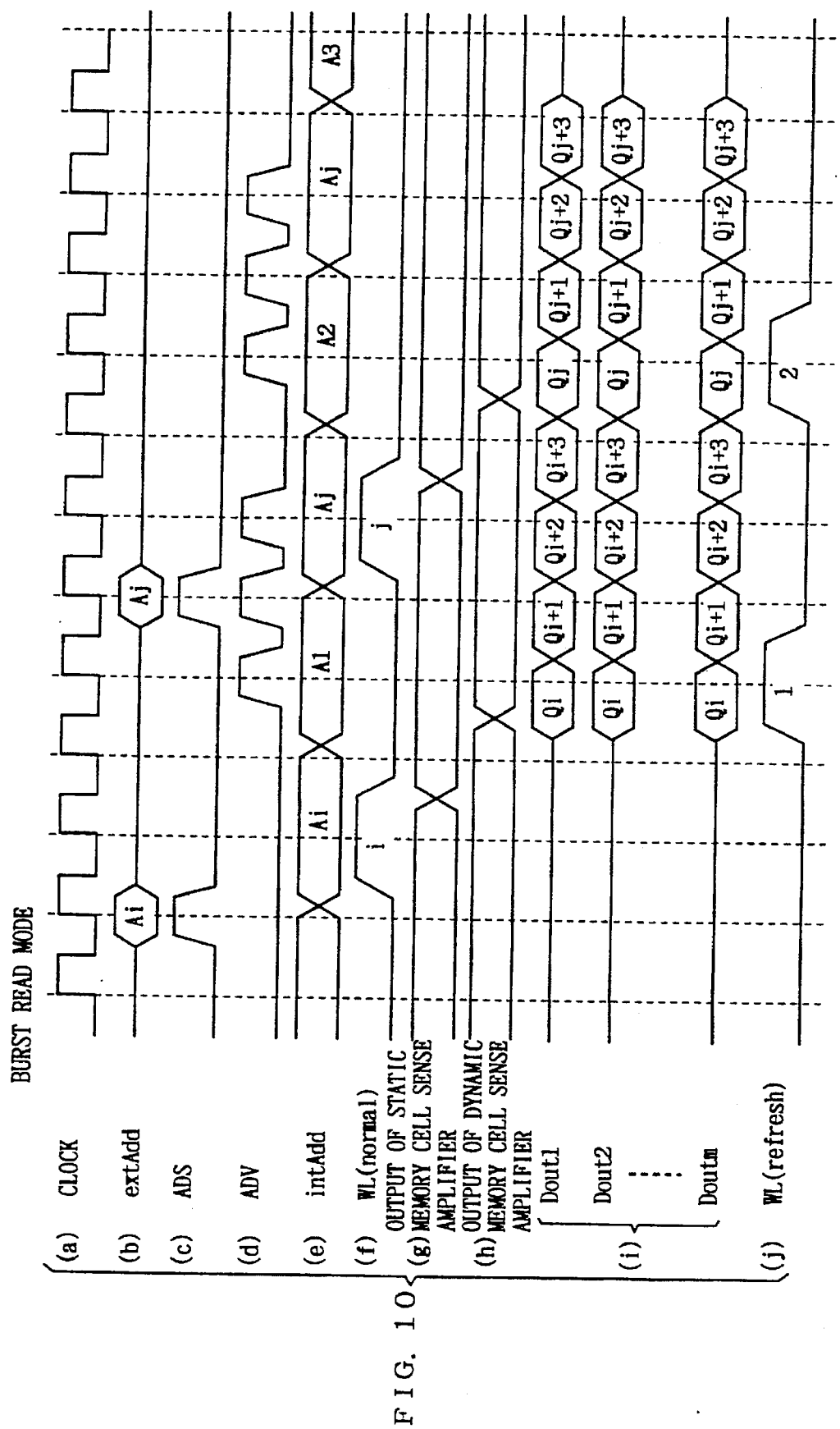
FIG. 10 is a timing chart of signals in effect when the semiconductor memory device shown in FIG. 9 operates in burst read mode.

FIG. 10 is a timing chart of signals in effect when the semiconductor memory device in the fourth embodiment operates in burst read mode. Referring to the timing chart of FIG. 10, one word line WLi is first selected in response to an external address signal Ai. This causes data to be read from all memory cells SMC and DMC connected to the selected word line WLi onto all bit line pairs SBL1, /SBL1 through SBLm, /SBLm and DBL1, /DBL1 through DBLm, /DBLm. Since the memory cells SMC operate at a higher speed than the memory cells DMC, the outputs of the SRAM type sense amplifiers 421 through 42m are determined more quickly than those of the DRAM type sense amplifiers 441 through 463m, as indicated by waveforms (g) ad (h) in FIG. 10.

Thus the sense amplifier and write driver train 42 latches m-bit data Qi more quickly than the sense amplifier and write driver train 44. The m-bit data Qi is transferred to the input/output register 47 for output via the bidirectional transfer bus group 45. While the m-bit data is being output from the SRAM type memory cell array 10, 3m-bit data from the DRAM type memory cell array 41 is latched into the sense amplifier and write driver train 44. The 3m-bit data is transferred to the input/output register train 48 via the bidirectional transfer bus group 46. Of the 3m-bit of data placed into the input/output register train 48, m bits of data Qi+1 are output following the data Qi. Another m bits of data Qi+2 are taken out of the 3m-bit data in the input/output register train 48 and are output. Thereafter, the remaining m bits of data Qi+3 are output from the input/output register train 48 holding the 3m-bit data.

While the 4m bits of data Qi through Qi+3 are being output in a burst operation, the potential of one word line is brought High (waveform (j) in FIG. 10). The memory cells SMC and DMC connected to that word line are refreshed in the same manner as in the preceding embodiments.

(2) Burst write mode

Figure 11:
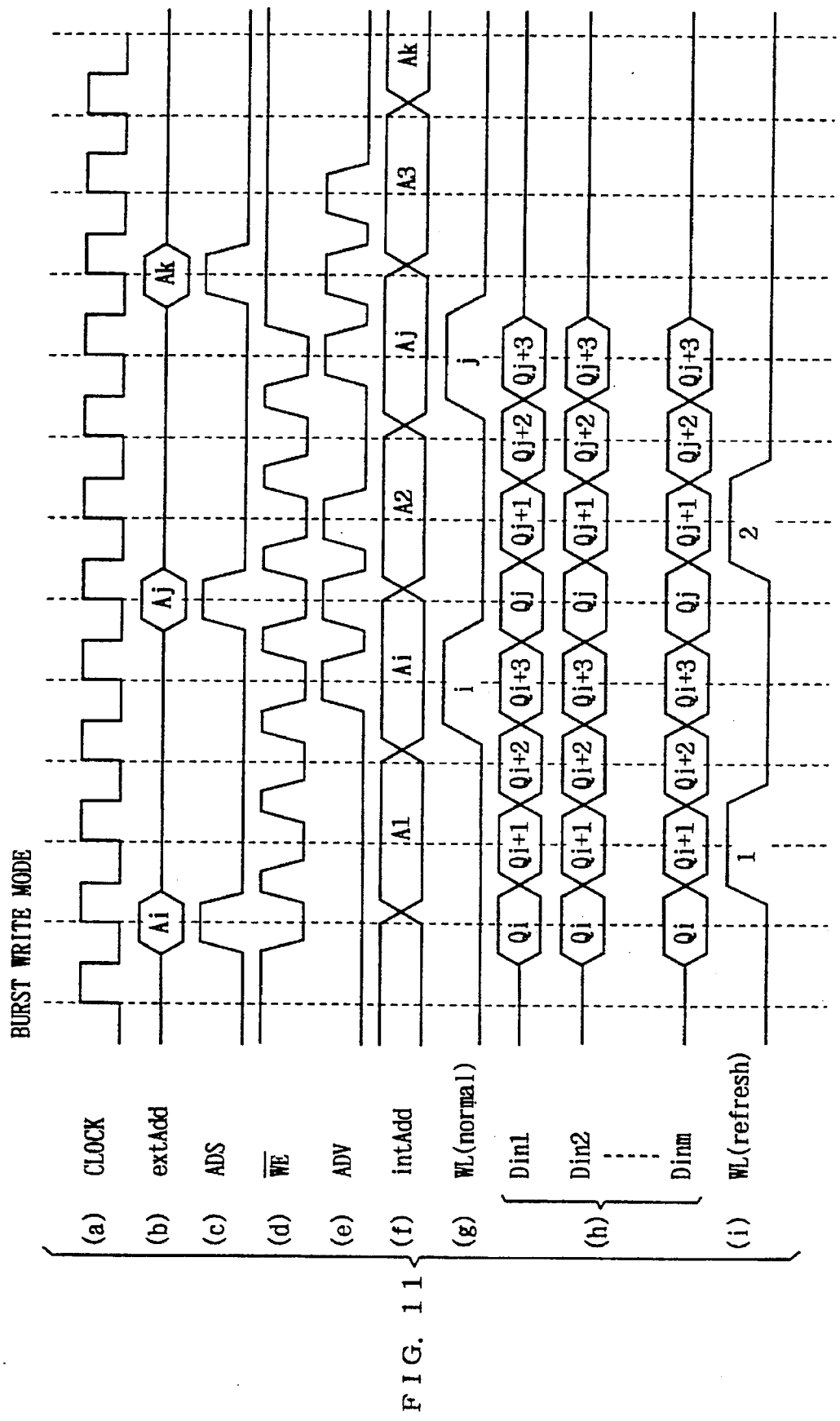
FIG. 11 is a timing chart of signals in effect when the semiconductor memory device shown in FIG. 9 operates in burst write mode.

FIG. 11 is a timing chart of signals in effect when the semiconductor memory device in the fourth embodiment operates in burst write mode. As shown in FIG. 11, the initially entered m bits of data Qi are stored into the corresponding m of SRAM type memory cells SMC. The ensuing 3m bits of data Qi+1 through Qi+3 are placed into the corresponding 3m DRAM type memory cells DMC. While the 4m bits of data Qi through Qi+3 are being placed into the input/output register trains 47 and 48, one word line WL1 is driven High (waveform (i) in FIG. 11). All memory cells SMC and DMC connected to that word line WL1 are refreshed in the same manner as in the preceding embodiments.

The fourth embodiment permits refresh operation in burst read/write mode, enabling the burst operation to be performed continuously. Because most of the component memory cells are each made up of one access transistor and one cell capacitor, a large-capacity semiconductor memory device is easy to fabricate. Since data start to be read from SRAM type memory cells SMC having a higher access speed than the DRAM type memory cells DMC, the correct data may be read out immediately after the target word line is brought High.

[Fifth Embodiment]

Figure 12:
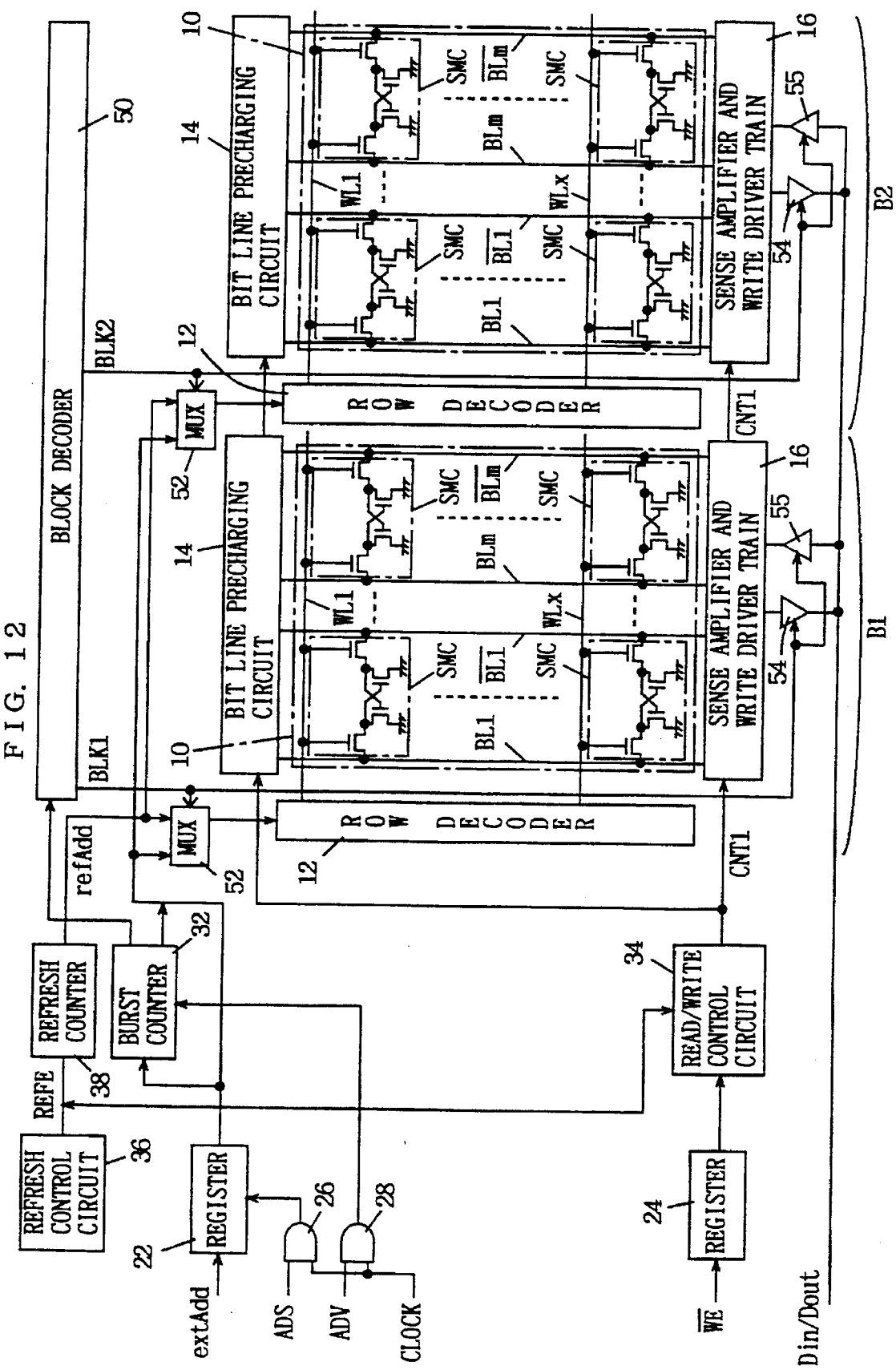
FIG. 12 is an overall block diagram of a semiconductor memory device practiced as a fifth embodiment of the invention.

FIG. 12 is an overall block diagram of a semiconductor memory device practiced as the fifth embodiment of the invention. Referring to FIG. 12, the fifth embodiment has two blocks B1 and B2 and a block decoder 50 for selecting one of the two blocks. Each block comprises a memory cell array 10, a row decoder 12, a bit line precharging circuit 14, a sense amplifier and write driver train 16, a read buffer 54, a write buffer 55 and a multiplexer (MUX) 52.

The output of the burst counter 32 is fed to the block decoder 50 and multiplexer 52. Given the output of the burst counter 32, the block decoder 50 generates either a block signal BLK1 for activating the block B1 or a block signal BLK2 for activating the block B2. The block signal BLK1 or BLK2 is supplied to the multiplexer 52, to the read buffer 54 and to the write buffer 55. The refresh address signal refAdd from the refresh counter 38 is given to the multiplexers 52 in both blocks B1 and B2. Responding to the block signal BLK1 or BLK2, the multiplexer 52 selects either the address signal from the address register 22 and burst counter 32, or the refresh address signal refAdd from the refresh counter 38. The selected address signal is fed to the row decoder 12. The read buffer 54 and write buffer 55 are each activated in response to the block signal BLK1 or BLK2. Thus in each of the blocks B1 and B2, the read buffer 54 and write buffer 55 constitute a multiplexer.

(1) Burst read mode (first example)

Figure 13:
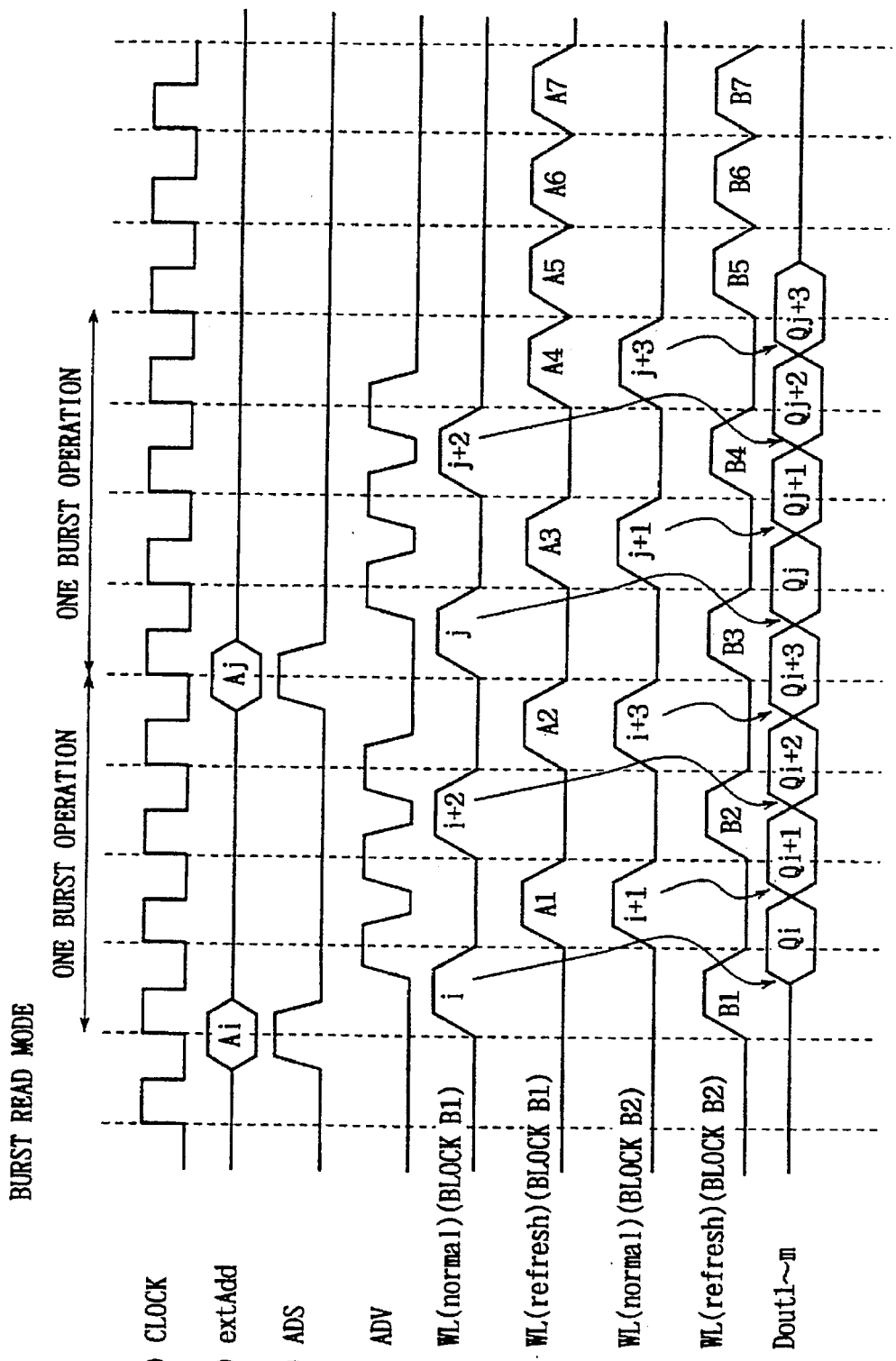
FIG. 13 is a timing chart of signals in effect when the semiconductor memory device shown in FIG. 12 operates in one typical burst read mode.

FIG. 13 is a timing chart of signals in effect when the semiconductor memory device in the fifth embodiment operates in one typical burst read mode. As shown in FIG. 13, driving the clock signal CLOCK raised while the address strobe signal ADS is at the high level admits the external address signal Ai into the address register 22. Of the bits making up the external address signal Ai, two bits are placed into the burst counter 32. The burst counter 32 is incremented when the clock signal CLOCK is raised while the advance signal ADV is at the high level. The value of the burst counter 32 is fed to the block decoder 50. Thus the block decoder 50 brings the block signals BLK1 and BLK2 High alternately. In other words, the block decoder 50 selects the blocks B1 and B2 alternately. When the block signal BLK1 is High, the multiplexer 52 in the block B1 supplies the row decoder 12 with the address signal from the address register 22 and burst counter 32. Thus in the block B1, the row decoder 12 selects one word line WLi corresponding to the external address signal Ai. Selecting the word line WLi causes data to be read from all memory cells SMC connected to the selected word line onto the bit line pairs BL1, /BL1 through BLm, /BLm. In addition, the m-bit data Qi is output via the sense amplifier column 16 and read buffer 54.

When the block signal BLK1 is driven High, the block signal BLK2 is brought Low. At this point, the multiplexer 52 in the block B2 supplies the row decoder 12 with the refresh address B1 from the refresh counter 38. Thus the row decoder 12 in the block B2 selects one word line corresponding to the refresh address signal B1. This refreshes all memory cells connected to the selected word line.

Driving the clock signal CLOCK raised while the advance signal ADV is at the high level increments the burst counter 32. Thus when the block signal BLK2 is brought High, the row decoder 12 is fed with an internal address signal Ai+1 from the address register 22 and burst counter 32 via the multiplexer 52 in the block B2. As a result, the row decoder 12 selects the word line WLi+1 corresponding to the internal address signal Ai+1. The potential of the selected word line WLi+1 is brought High (waveform (g) in FIG. 13). This enables the m-bit data Qi+1 to be output from all memory cells SMC connected to the selected word line WLi+1.

When the block signal BLK2 is driven High, the block signal BLK1 is brought Low. At this point, the refresh address signal A1 from the refresh counter 38 is fed to the row decoder 12 via the multiplexer 52 in the block B1. Thus the row decoder 12 selects the word line corresponding to the refresh address signal A1. This refreshes all memory cells SMC connected to the selected word line.

In like manner, while the m-bit data Qi+2 is output from the block B1, memory cells in the block B2 are refreshed;

while the m-bit data Qi+3 is output from the block B2, memory cells in the block B1 are refreshed.

As described, m bits of data are read alternately from the blocks B1 and B2 in response to one external address signal Ai. In such a burst operation, memory cells in the block B2 are refreshed while data is being read from the block B1; conversely, memory cells in the block B1 are refreshed while data is being read from the block B2.

(2) Burst write mode (first example)

Figure 14:
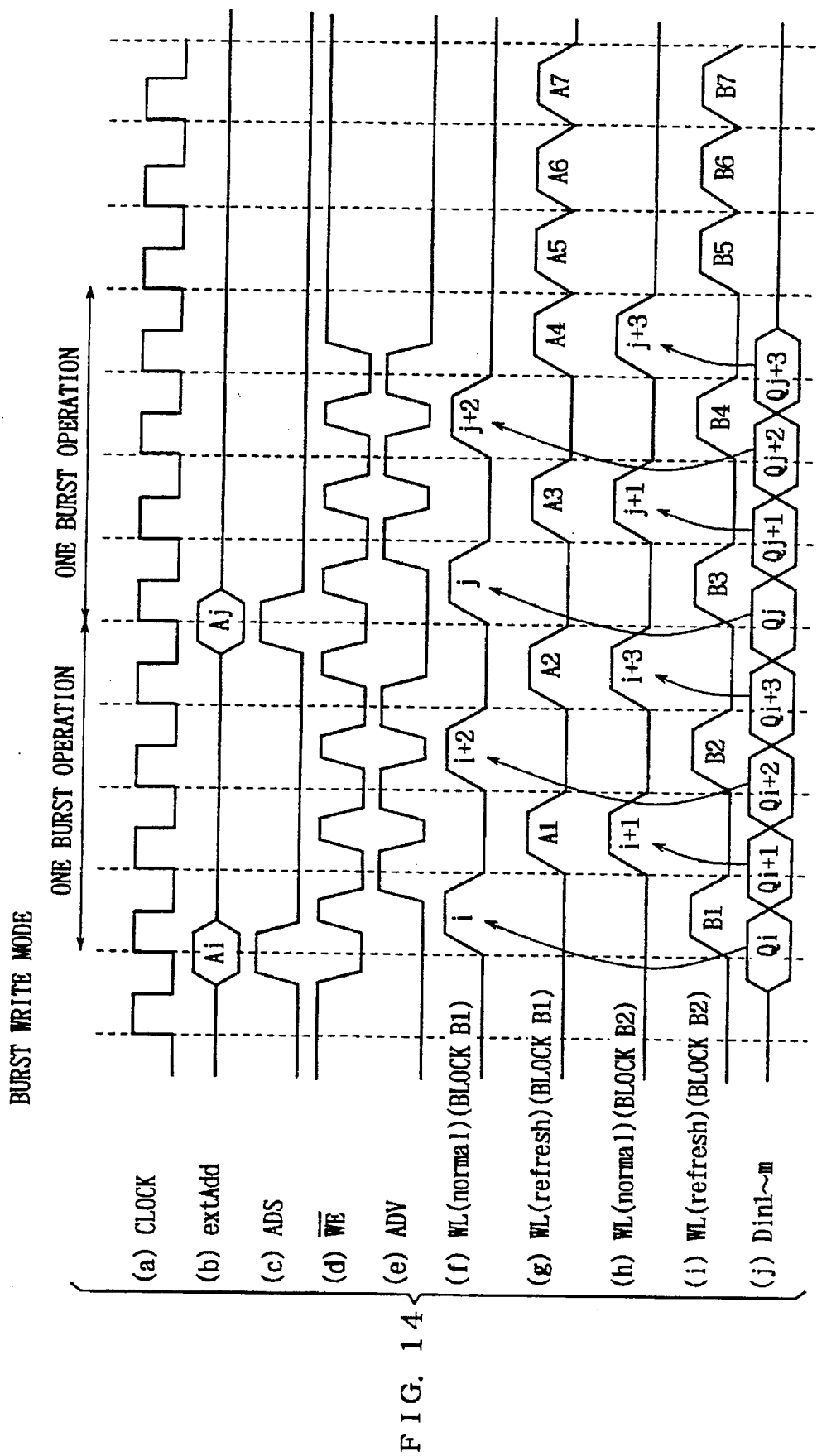
FIG. 14 is a timing chart of signals in effect when the semiconductor memory device shown in FIG. 12 operates in one typical burst write mode.

FIG. 14 is a timing chart of signals in effect when the semiconductor memory device in the fifth embodiment operates in one typical burst write mode. As shown in FIG. 14, the initially supplied m bits of data Qi are written to the memory cells SMC connected to the word line corresponding to the internal address signal Ai. During the data write operation to the block B1, the memory cells SMC connected to the word line corresponding to the refresh address signal B1 are refreshed in the block B2.

The subsequently supplied m bits of data Qi+1 are written to the memory cells SMC connected to the word line corresponding to the internal address signal Ai+1 in the block B2. During the write operation, the memory cells SMC connected to the word line corresponding to the refresh address signal Ai are refreshed in the block B1.

In like manner, the m bits of data Qi+2 supplied next are written to memory cells in the block B1. During the write operation of the data Qi+2, memory cells in the block B2 are refreshed. The m bits of data Qi+3 supplied thereafter are written to memory cells in the block B2. With the data Qi+3 being written, memory cells in the block B1 are refreshed.

As described, in response to one external address signal Ai, the data Qi through Qi+3 supplied four times consecutively in units of m bits are written to the blocks B1 and B2 alternately. During the data write operation to memory cells SMC in the block B1, memory cells in the block B2 are refreshed. Conversely, while data is being written to memory cells SMC in the block B2, memory cells SMC in the block B1 are refreshed. That is, during a burst operation across the blocks B1 and B2, the refresh operation is performed therein alternately.

(3) Burst read mode (second example)

Figure 15:
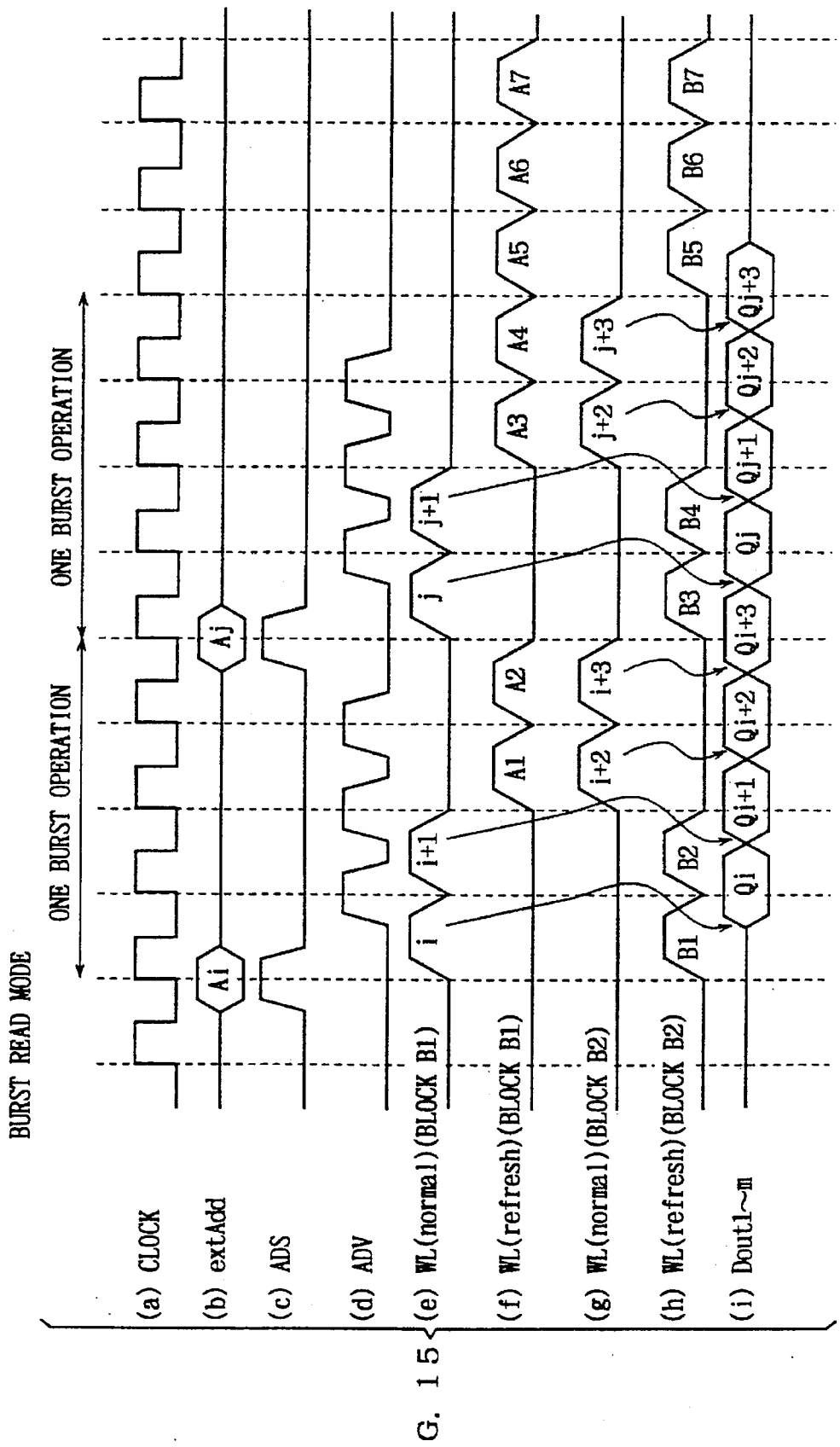
FIG. 15 is a timing chart of signals in effect when the semiconductor memory device shown in FIG. 12 operates in another burst read mode.

FIG. 15 is a timing chart of signals in effect when the semiconductor memory device in the fifth embodiment operates in another burst read mode. In this burst read mode, as shown in FIG. 15, data Qi and Qi+1 are first read consecutively from memory cells SMC in the block B1. Then data Qi+2 and Qi+3 are read successively from memory cells SMC in the block B2. While the data Qi and Qi+1 are being read from memory cells SMC in the block B1, memory cells SMC in the block B2 are refreshed consecutively. Likewise, while the data Qi+2 and Qi+3 are being read from memory cells SMC in the block B2, memory cells SMC in the block B1 are refreshed successively.

In this manner, where two sets of data are read alternately from the blocks B1 and B2, memory cells may be refreshed in the block form which data is not read.

(4) Burst write mode (second example)

Figure 16:
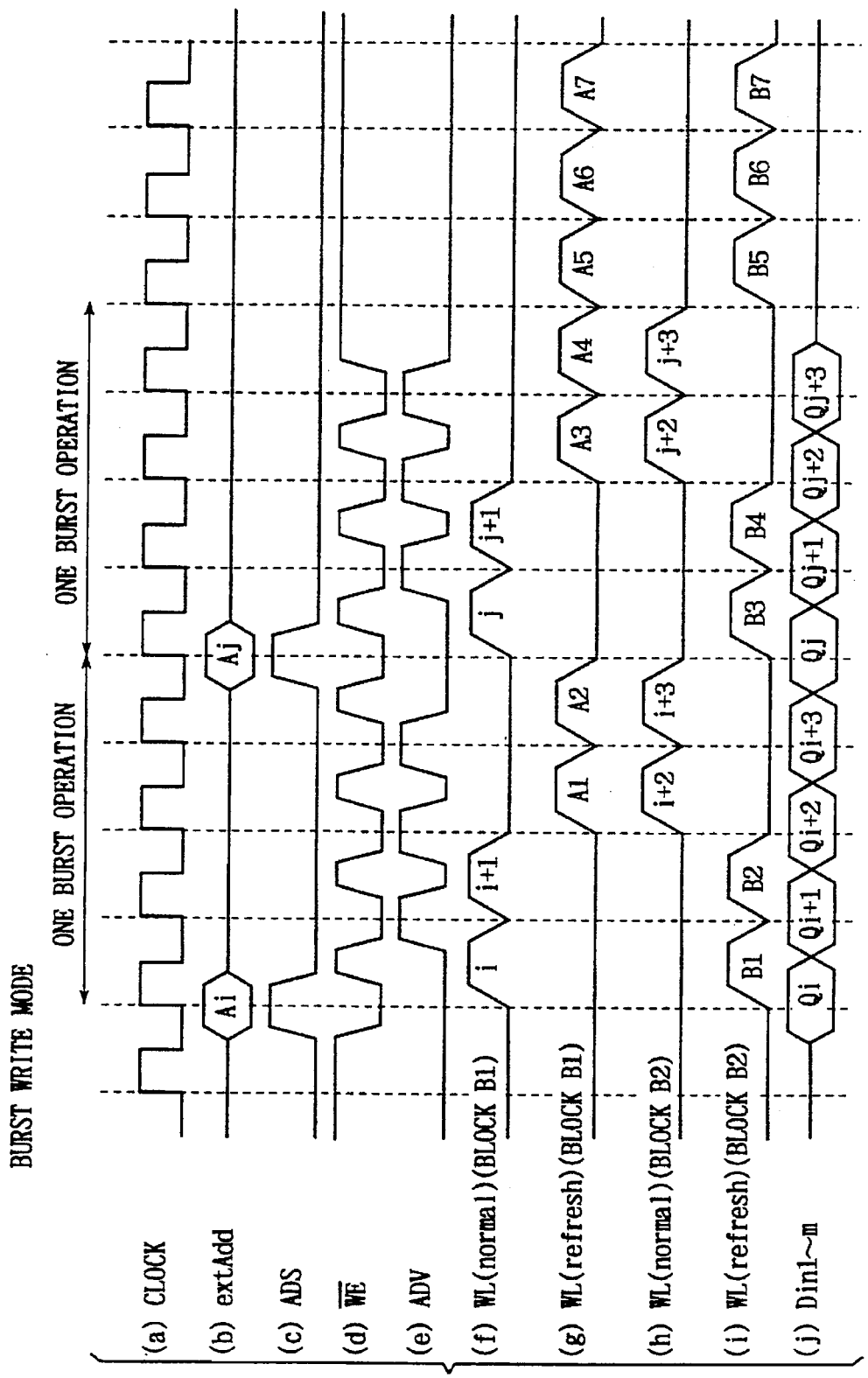
FIG. 16 is a timing chart of signals in effect when the semiconductor memory device shown in FIG. 12 operates in another burst write mode.

FIG. 16 is a timing chart of signals in effect when the semiconductor memory device in the fifth embodiment operates in another burst write mode. In this burst write mode, as illustrated in FIG. 16, data Qi and Qi+1 are written consecutively to memory cells SMC in the block B1, and data Qi+2 and Qi+3 are written successively to memory cells SMC in the block B2. While the data Qi and Qi+1 are being written to memory cells SMC in the block B1, memory cells SMC in the block B2 are refreshed consecutively. Likewise, while the data Qi+2 and Qi+3 are being written to memory cells SMC in the block B2, memory cells SMC in the block B1 are refreshed.

In this manner, where sets of data are written continuously to the blocks B1 and B2, memory cells may be refreshed in the block to which data is not written.

[Sixth Embodiment]

Figure 17:
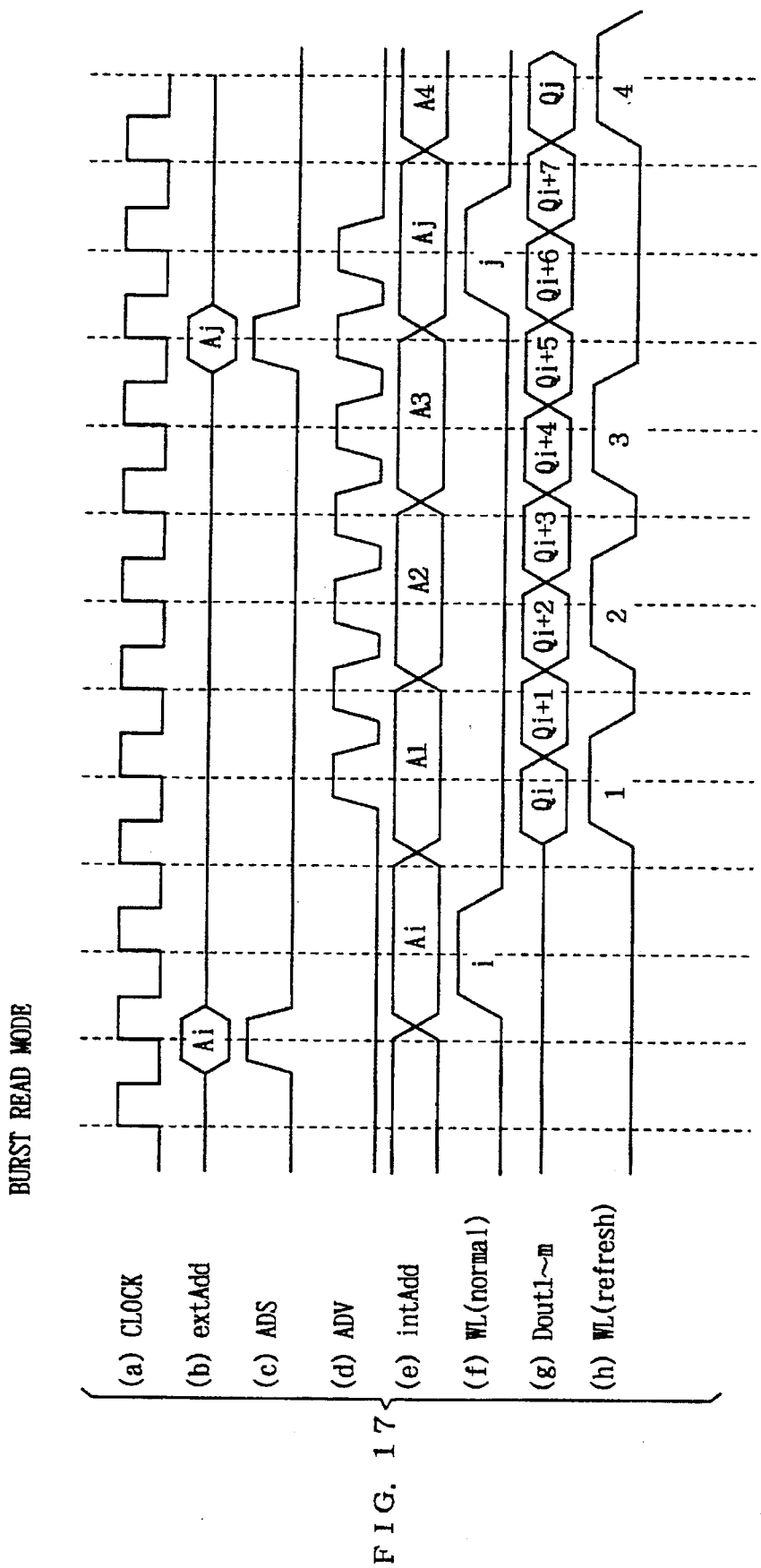
FIG. 17 is a timing chart of signals in effect when a semiconductor memory device practiced as a sixth embodiment of the invention operates in burst read mode.

In the preceding embodiments, one refresh operation is carried out during one burst operation. Alternatively, two or more refresh operations may be performed during one burst operation if the latter takes an appreciably long time to finish. FIG. 17 is a timing chart of signals in effect when a semiconductor memory device practiced as the sixth embodiment of the invention operates in burst read mode. In this case, three refresh operations take place during one burst read operation.

As shown in FIG. 17, when one word line WLi is selected in response to an external address signal Ai, data is read from all memory cells connected to the selected word line WLi. In this example, one address strobe signal ADS is matched with seven advance signals ADV. This allows data Qi through Qi+7 of m bits each to be output eight times consecutively, with the result that the period in which no word line is selected to be read is prolonged (waveform (f) in FIG. 17). Taking advantage of this nonselection period, the sixth embodiment selects three word lines successively to refresh all memory cells connected to these three selected word lines.

[Seventh Embodiment]

Figure 18:
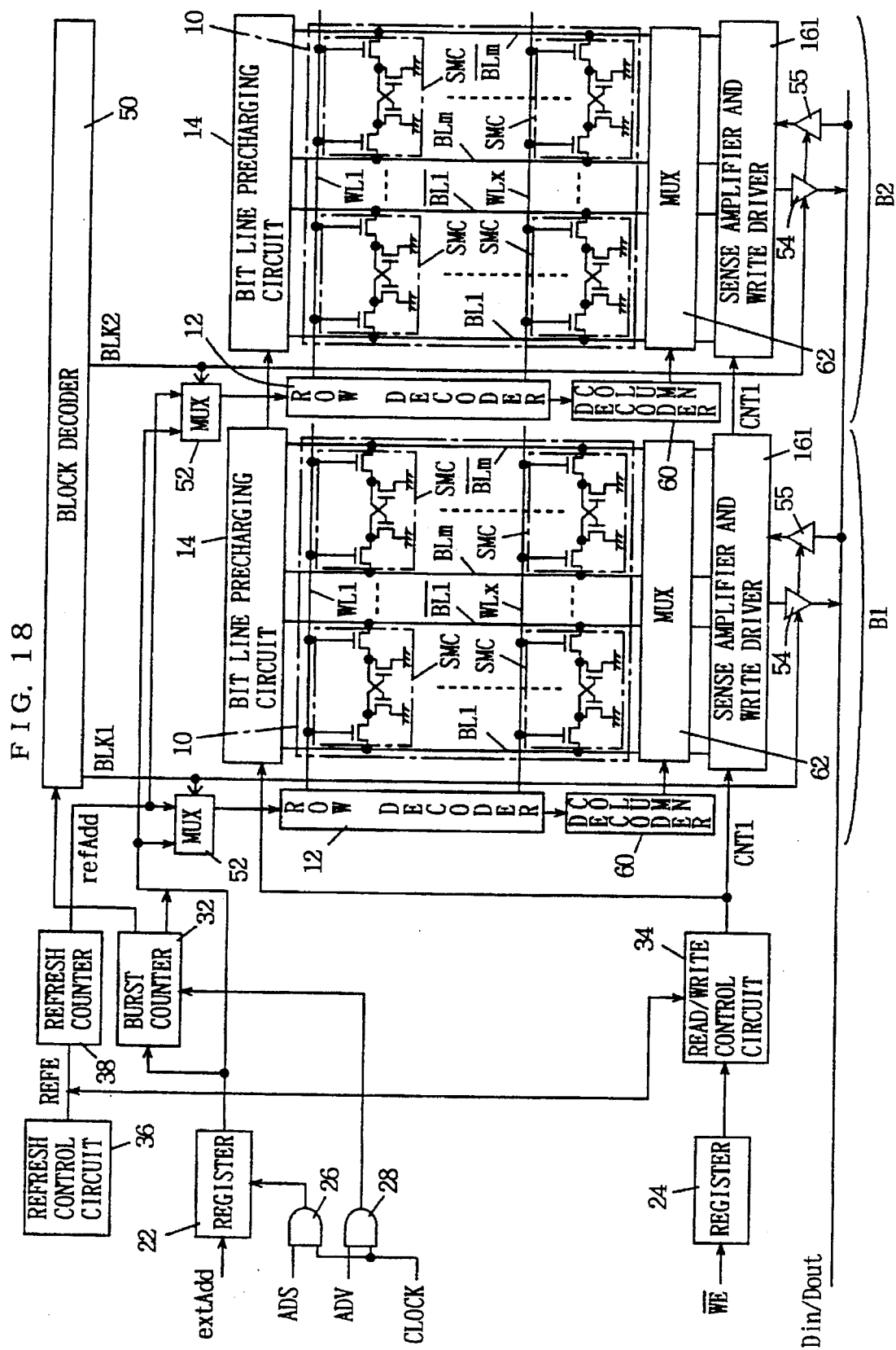
FIG. 18 is an overall block diagram of a semiconductor memory device practiced as a seventh embodiment of the invention.

FIG. 18 is an overall block diagram of a semiconductor memory device practiced as the seventh embodiment of the invention. Referring to FIG. 18, each block in the seventh embodiment comprises a column decoder 60, a multiplexer 62, and a sense amplifier and write driver 161. These component parts are what makes the seventh embodiment different from the fifth embodiment of FIG. 12. In the seventh embodiment, an internal address signal from the burst counter 32 is fed to the column decoder 60 via the multiplexer 52 and row decoder 12. Responding to the decoded signal from the column decoder 60, the multiplexer 62 selects one of the bit line pairs BL1, /BL through BLm, /BLm, and connects the selected bit line pair to the sense amplifier and write driver 161 matched with the multiplexer 62.

Specifically, what takes place in the above burst read mode is as follows: of the m bits of data read out onto the bit line pairs BL1, /BL1 through BLm, /BLm, one bit of data is supplied to the sense amplifier 161 by the multiplexer 62. The supplied one-bit data is amplified by the sense amplifier 161 and output via the read buffer 54. The remaining (m−1) bits of data are also fed one bit at a time to the sense amplifier 161 and output via the read buffer 54.

In burst write mode, m bits of data are supplied one bit at a time to the write driver 161 via the write buffer 55. The supplied data is amplified by the write driver 161 and fed successively by the multiplexer 62 to the bit line pairs BL1, /BL1 through BLm, /BLm.

In the seventh embodiment, too, a refresh operation is performed in the block B2 while a read operation is being carried out in the block B1; conversely, a refresh operation is conducted in the block B1 while a read operation is being executed in the block B2. Likewise, while a write operation is under way in the block B1, a refresh operation is performed in the block B2; during a write operation in the block B2, a refresh operation is carried out in the block B1.

With the seventh embodiment, the column decoder 60 and multiplexer 62 are arranged to select one of the bit line pairs BL1, /BL1 through BLm, /BLm. This means that only one sense amplifier and write driver 161 needs to be furnished.

[Eighth Embodiment]

Figure 19:
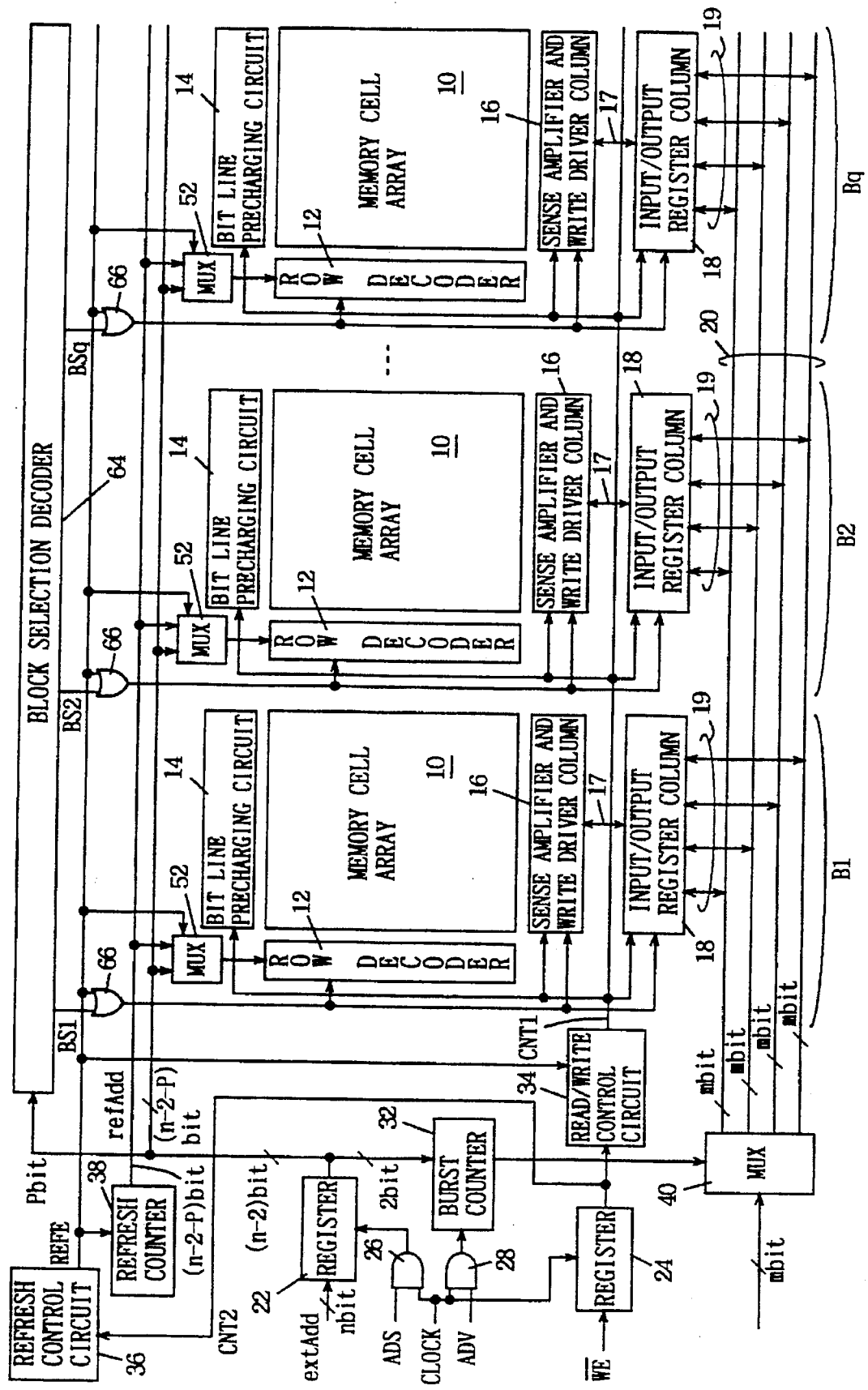
FIG. 19 is an overall block diagram of a semiconductor memory device practiced as an eighth embodiment of the invention.

FIG. 19 is an overall block diagram of a semiconductor memory device practiced as the eighth embodiment of the invention. Referring to FIG. 19, the eighth embodiment comprises q of blocks B1 through Bq and a block selection decoder 64. Each block includes a memory cell array 10, a row decoder 12, a bit line precharging circuit 14, a sense amplifier and write driver train 16, an input/output register train 18, a multiplexer 52, and an OR gate 66. When the refresh enable signal REFE is brought Low, the multiplexer 52 supplies the row decoder 12 with an (n–2–p)-bit internal address signal from the address register 22. When the refresh enable signal REFE is driven High, the multiplexer 52 feeds the row decoder 12 with an (n–2–p)-bit refresh address signal refAdd from the refresh counter 38. The block selection decoder 64 drives High one of block selection signals BS1 through BSq in response to a p-bit internal address signal from the address register 22. The OR gate 66 receives and operates on one block selection signal and the refresh enable signal REFE. The result of the OR operation is output to the row decoder 12, to the sense amplifier and write driver train 16 and to the input/output register train 18. Thus each block is activated when either the corresponding block selection signal or the refresh enable signal REFE is driven High.

(1) Burst read mode

Figure 20:
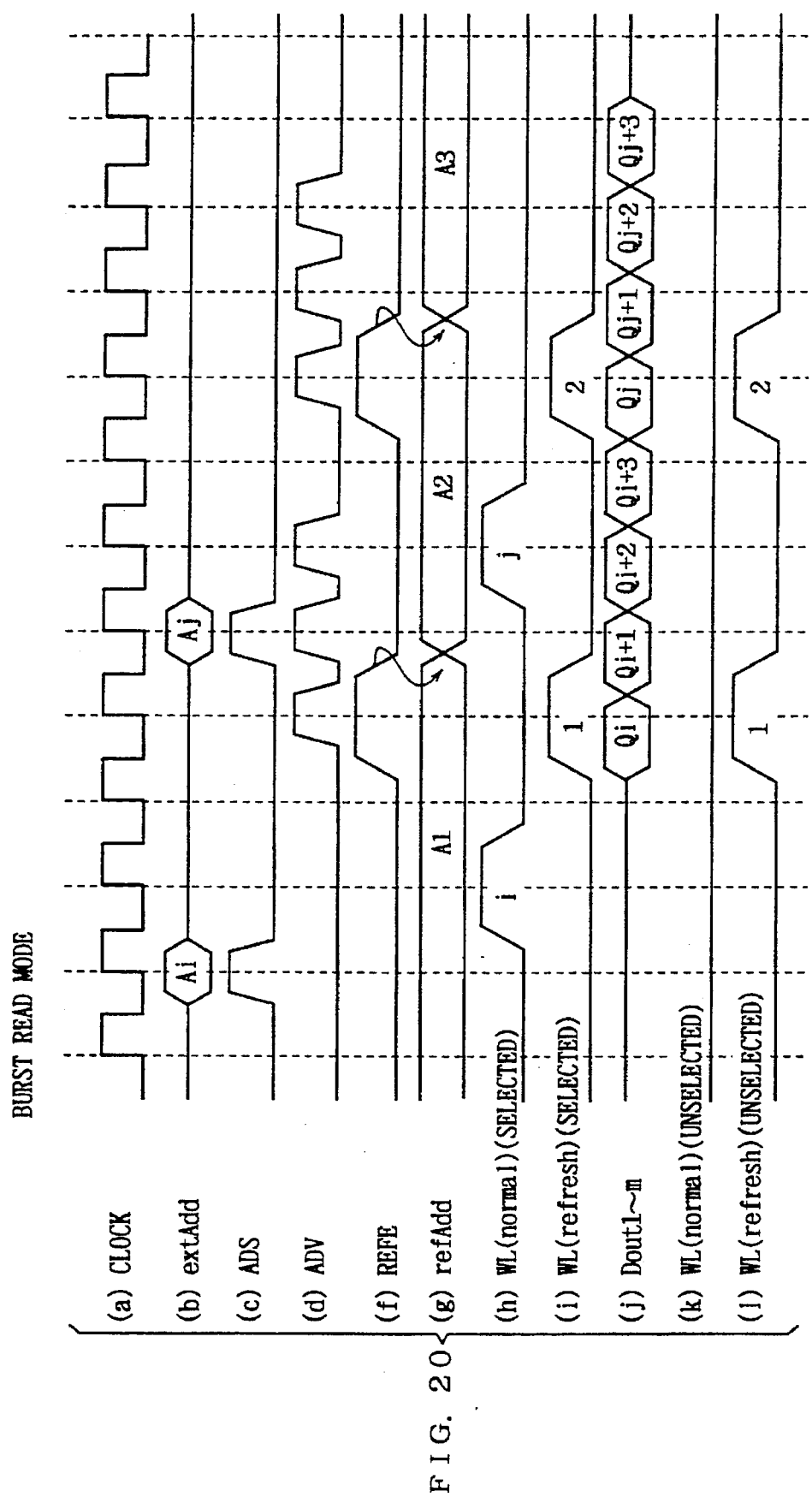
FIG. 20 is a timing chart of signals in effect when the semiconductor memory device shown in FIG. 19 operates in burst read mode.

FIG. 20 is a timing chart of signals in effect when the semiconductor memory device in the eighth embodiment operates in burst read mode. Illustratively, when the block selection signal BS1 alone is brought High among the block selection signals BS1 through BSq, only the block B1 is activated. As a result, of the bits constituting the external address signal Ai in the address register 22, the (n–2–p)-bit internal address signal is fed to the row decoder 12 via the multiplexer 52 in the block B1. Given the internal address signal, the row decoder 12 selects one word line. The potential of the selected word line is driven High (waveform (h) in FIG. 20). This causes data to be read from all memory cells connected to the selected word line. The retrieved data is latched into the input/output register train 18 via the sense amplifier column 16 and bidirectional transfer bus 17. The 4m bits of data latched in the input/output register train 18 are output m bits at a time in response to the signal from the burst counter 32. That is, as depicted in FIG. 20 (waveform (j)), the m-bit data Qi is output first followed by the data Qi+1, Qi+2 and Qi+3, in that order.

Meanwhile, when the refresh enable signal REFE is brought High (waveform (f) in FIG. 20) during the data burst output, the high-level refresh enable signal REFE is fed to the row decoders 12 of all blocks B1 through Bq through their OR gates 66. This means that the unselected blocks B2 through Bq are also activated. With the refresh enable signal REFE at the high level, the refresh address signal A1 from the refresh counter 38 is sent to the row decoders 12 of all blocks B1 through Bq through their multiplexers 52. Thus not only in the selected block B1 but also in the unselected blocks B2 through Bq, the potential of one word line corresponding to the refresh address signal A1 is driven High (waveforms (i) and (l) in FIG. 20). This refreshes all memory cells connected to the selected word line. The refresh address signal refAdd is incremented in response to a trailing edge of the refresh enable signal REFE.

(2) Burst write mode

Figure 21:
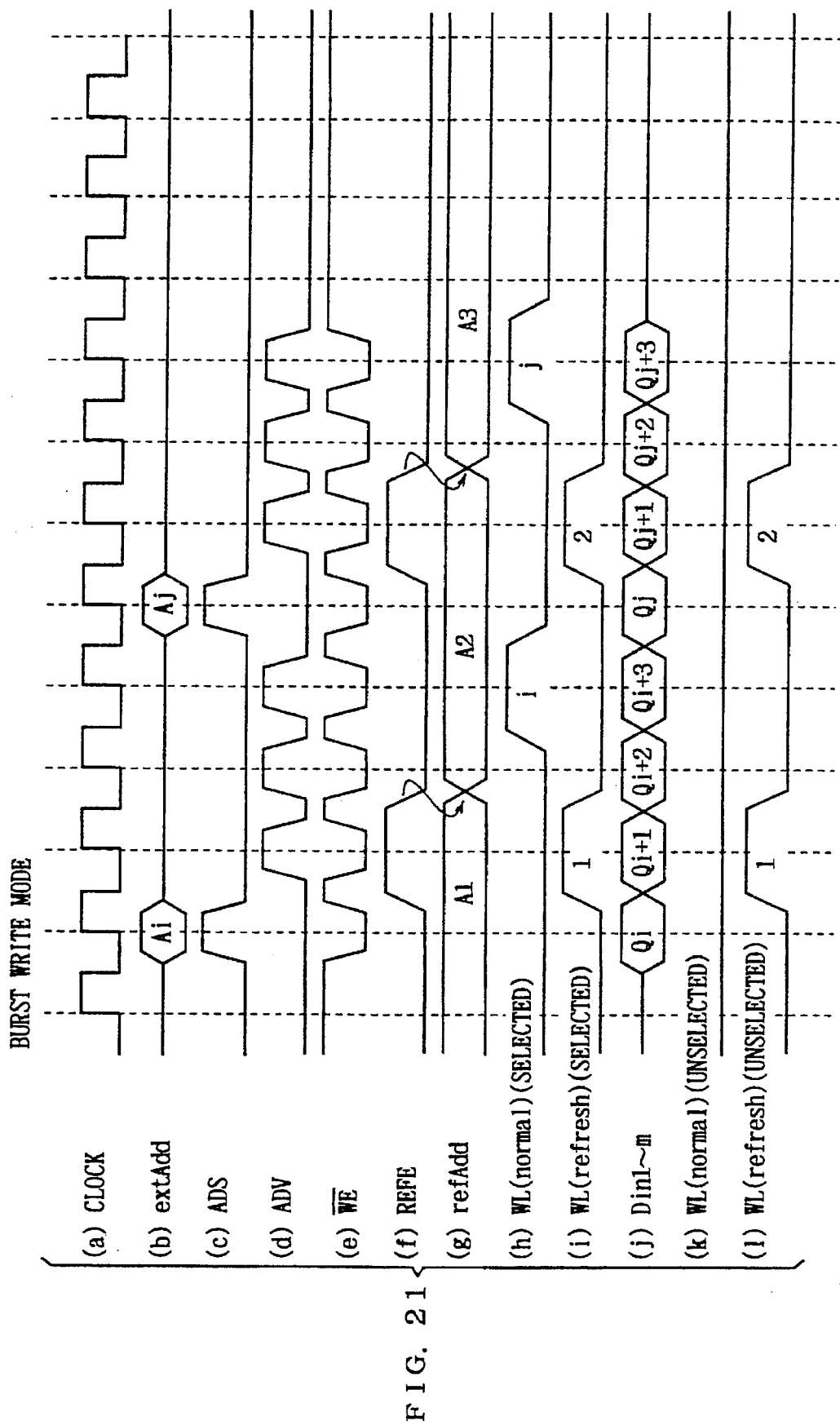
FIG. 21 is a timing chart of signals in effect when the semiconductor memory device shown in FIG. 19 operates in burst write mode.

FIG. 21 is a timing chart of signals in effect when the semiconductor memory device in the eighth embodiment operates in burst write mode. In burst write mode, as shown in FIG. 21 (waveform (j)), data Qi through Qi+3 of m bits each are latched into the input/output register train 18 of a selected block (e.g., B1). Then with one word line driven High (waveform (h)) in the selected block B1, the 4m-bit data Qi through Qi+3 are written to all memory cells connected to the high-level word line.

When the refresh enable signal REFE is driven High (waveform (f) in FIG. 21) during the burst input of the data Qi through Qi+3, not only the selected block but also the unselected blocks are activated. It follows that the row decoder 12 in each of the blocks B1 through Bq selects one word line in response to the supplied refresh address signal A1. This drives the selected word line High (waveforms (i) and (l)), thereby refreshing all memory cells connected to that word line.

In this manner, while a burst operation is under way in the selected block, a refresh operation may be carried out not only in the selected block but also in the unselected blocks of the eighth embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    memory cell array including
        a plurality of word lines,
        a plurality of bit line pairs crossing said word lines,
        a plurality of memory cells corresponding to the crossings between said word lines and said bit line pairs, each connected to the corresponding word line and at least one bit line of the corresponding bit line pairs;
    decoding means for decoding an internal address signal to select one of said word lines;
    a plurality of storing means corresponding to said bit line pairs, each storing data transferred from the corresponding bit line pair;
    output means for consecutively outputting said data from each of said storing means;
    refresh address generating means for generating a predetermined refresh address signal; and
    internal address supplying means for supplying said decoding means with an externally supplied external address signal as said internal address signal, and supplying said decoding means with said refresh address signal instead of said external address signal upon transferring of data from said bit line pairs to said storing means.

2. A semiconductor memory device according to claim 1, wherein said refresh address generating means generates consecutively at least two refresh address signals from the time data is transferred from said bit line pairs to said storing means until the time the next data is transferred from said bit line pairs to said storing means.

3. A semiconductor memory device according to claim 1, wherein said refresh address generating means generates consecutively said refresh address signals so that said decoding means selects each of said word lines at prescribed intervals.

4. A semiconductor memory device according to claim 1, wherein each of said memory cells includes:
    an access transistor connected between one bit line of said corresponding bit line pair and a memory node, said access transistor being turned on in response to a potential level of said corresponding word line; and a cell capacitor connected between said memory node and a predetermined potential node to which a predetermined potential is supplied.

5. A semiconductor memory device according to claim 1, wherein each of said memory cells includes:

a first access transistor connected between one bit line of said corresponding bit line pair and a first memory node, said first access transistor being turned on in response to a potential level of said corresponding word line;

a second access transistor connected between the other bit line of said corresponding bit line pair and a second memory node, said second access transistor being turned on in response to a potential level of said corresponding word line;

a first driver transistor connected between said first memory node and a grounding node, said first driver transistor being turned on in response to a potential level of said second memory node; and a second driver transistor connected between said second memory node and a ground node, said second driver transistor being turned on in response to a potential level of said first memory node.

6. A semiconductor memory device comprising:

a memory cell array including
 a plurality of word lines,
 a plurality of bit line pairs crossing said word lines,
a plurality of memory cells corresponding to the crossings between said word lines and said bit line pairs, each connected to the corresponding word line and at least one bit line of the corresponding bit line pairs;

decoding means for decoding an internal address signal to select one of said word lines;

a plurality of storing means corresponding to said bit line pairs, each storing data to be transferred to the corresponding bit line pair;

input means for consecutively inputting externally supplied data to each of said storing means;

refresh address generating means for generating a predetermined refresh address signal; and internal address supplying means for supplying said decoding means with an externally supplied external address signal as said internal address signal, and supplying said decoding means with said refresh address signal instead of said external address signal before data is transferred from said storing means to said bit line pairs.

7. A semiconductor memory device according to claim 6, wherein each of said memory cells includes:

an access transistor connected between one bit line of said corresponding bit line pair and a memory node, said access transistor being turned on in response to a potential level of said corresponding word line; and a cell capacitor connected between said memory node and a predetermined potential node to which a predetermined potential is supplied.

8. A semiconductor memory device according to claim 6, wherein each of said memory cells includes:

a first access transistor connected between one bit line of said corresponding bit line pair and a first memory node, said first access transistor being turned on in response to a potential level of said corresponding word line;

a second access transistor connected between the other bit line of said corresponding bit line pair and a second memory node, said second access transistor being turned on in response to a potential level of said corresponding word line;

a first driver transistor connected between said first memory node and a ground node, said first driver transistor being turned on in response to a potential level of said second memory node; and a second driver transistor connected between said second memory node and a ground node, said second driver transistor being turned on in response to a potential level of said first memory node.

9. A semiconductor memory device comprising:

a first memory cell array including a plurality of first memory cells arranged in a matrix made of a plurality of rows and a plurality of first columns, each of said first memory cells having a first access speed;

a second memory cell array located on one side of and adjacent to said first memory cell array in the direction of row extensions, said second memory array including a plurality of second memory cells arranged in a matrix made of said plurality of rows and at least one second column, each of said second memory cells having a second access speed higher than said first access speed;

a plurality of word lines arranged in said plurality of rows and connected to said first and second memory cells;

a plurality of first bit line pairs arranged in said plurality of first columns and connected to said first memory cells;

at least one second bit line pair arranged in said second column and connected to said second memory cell;

decoding means for decoding an internal address signal to select one of said word lines;

a plurality of first storing means corresponding to said first bit line pairs, each storing data transferred from the corresponding first bit line pair;

at least one second storing means corresponding to said second bit line pair, storing data transferred from the corresponding second bit line pair;

output means for consecutively outputting said data from said first and second storing means;

refresh address generating means for generating a predetermined refresh address signal; and internal address supplying means for supplying said decoding means with an externally supplied external address signal as said internal address signal, and supplying said decoding means with said refresh address signal instead of said external address signal after data is transferred from said first and second bit line pairs to said first and second storing means.

10. A semiconductor memory device according to claim 9, wherein each of said first memory cells includes:

a first access transistor connected between one bit line of said corresponding first bit line pair and a first memory node, said first access transistor being turned on in response to a potential level of the corresponding word line; and a cell capacitor connected between said first memory node and a predetermined potential node to which a predetermined potential is supplied; and wherein each of said second memory cells includes:

a second access transistor connected between one bit line of said corresponding second bit line pair and a second memory node, said second access transistor being turned on in response to a potential level of said corresponding word line;

a third access transistor connected between the other bit line of said corresponding second bit line pair and a third memory node, said third access transistor being turned on in response to a potential level of said corresponding word line;

a first driver transistor connected between said second memory node and a ground node, said first driver transistor being turned on in response to a potential level of said third memory node; and a second driver transistor connected between said third memory node and a ground node, said second driver transistor being turned on in response to a potential level of said second memory node.

11. A semiconductor memory device comprising:

a plurality of blocks each including,
  (a) a memory cell array including
a plurality of word lines,
a plurality of bit line pairs crossing said word lines,
a plurality of memory cells corresponding to the crossings between said word lines and said bit line pairs, each connected to the corresponding word line and at least one bit line of the corresponding bit line pairs;
  (b) decoding means for decoding an internal address signal to select one of said word lines; and
  (c) a plurality of storing means corresponding to said bit line pairs, each storing data transferred from the corresponding bit line pair;

said semiconductor memory device further comprising:
  output means for consecutively outputting said data from said storing means;
  refresh address generating means for generating a predetermined refresh address signal; and
  internal address supplying means for supplying said decoding means of each of said blocks with an externally supplied external address signal as said internal address signal, and supplying said decoding means with said refresh address signal instead of said external address signal after data is transferred from said bit line pairs to said storing means of each of said blocks.

12. A semiconductor memory device comprising:

a plurality of blocks each including
  (a) a memory cell array including
a plurality of word lines,
a plurality of bit line pairs crossing said word lines,
a plurality of memory cells corresponding to the crossings between said word lines and said bit line pairs, each connected to the corresponding word line and at least one bit line of the corresponding bit line pairs;
  (b) decoding means for decoding an internal address signal to select one of said word lines; and
  (c) a plurality of storing means corresponding to said bit line pairs, each storing data to be transferred to the corresponding bit line pair;

said semiconductor memory device further comprising:

input means for consecutively inputting externally supplied data to said storing means;

refresh address generating means for generating a predetermined refresh address signal; and internal address supplying means for supplying said decoding means of each of said blocks with an externally external address signal as said internal address signal, and supplying said decoding means with said refresh address signal instead of said external address signal before data is transferred from said storing means to said bit line pairs of each of said blocks.

* * * * *